(12) United States Patent  (10) Patent No.: US 7,692,265 B2
Takewaki et al. (45) Date of Patent: Apr. 6, 2010

(54) FUSE AND SEAL RING

(75) Inventors: Toshiyuki Takewaki, Kanagawa (JP);
Noriaki Oda, Kanagawa (JP)

(73) Assignee: NEC Electronics Corporation,
Kanagawa (JP)

( * ) Notice: Subject to any disclaimer, the term of this patent is extended or adjusted under 35 U.S.C. 154(b) by 96 days.

(21) Appl. No.: 11/094,151

(22) Filed: Mar. 31, 2005

(65) Prior Publication Data

US 2005/0218477 A1 Oct. 6, 2005

(30) Foreign Application Priority Data

Mar. 31, 2004 (JP) .............................. 2004-101882

(51) Int. Cl.
*H01L 29/00* (2006.01)
(52) U.S. Cl. .............................. 257/529; 257/E23.149; 438/601
(58) Field of Classification Search ................. 257/209, 257/529, E23.149, E29.149; 365/200; 438/132, 438/215, 281, 601
See application file for complete search history.

(56) References Cited

U.S. PATENT DOCUMENTS

| 5,519,658 | A | * | 5/1996 | Uda et al. ..................... 365/200 |
| 5,679,597 | A | * | 10/1997 | Moon ........................... 438/60 |
| 6,100,116 | A | * | 8/2000 | Lee et al. ..................... 438/128 |
| 6,100,118 | A | * | 8/2000 | Shih et al. .................... 438/132 |
| 6,348,742 | B1 | * | 2/2002 | MacPherson ................ 257/786 |
| 6,835,642 | B2 | * | 12/2004 | Yang et al. ................... 438/601 |
| 6,867,441 | B1 | * | 3/2005 | Yang et al. ................... 257/209 |
| 6,876,057 | B2 | * | 4/2005 | Watanabe ..................... 257/529 |
| 2002/0024115 | A1 | * | 2/2002 | Ibnabdeljalil et al. ....... 257/620 |
| 2003/0227089 | A1 | * | 12/2003 | Watanabe et al. ............ 257/758 |
| 2005/0161766 | A1 | * | 7/2005 | Sato et al. .................... 257/529 |
| 2006/0118904 | A1 | * | 6/2006 | Liaw ............................ 257/529 |

FOREIGN PATENT DOCUMENTS

| JP | 07-263558 | 10/1995 |
| JP | 2000-299381 | 10/2000 |
| JP | 2003-86590 | 3/2003 |
| JP | 2003-086687 | 3/2003 |
| JP | 2003-209173 | 7/2003 |
| JP | 2004-064046 | 2/2004 |

OTHER PUBLICATIONS

Japanese Patent Office issued a Japanese Office Action dated Dec. 15, 2009, Application No. 2004-101882.

* cited by examiner

*Primary Examiner*—Lex Malsawma
*Assistant Examiner*—William F Kraig
(74) *Attorney, Agent, or Firm*—Young & Thompson

(57) ABSTRACT

There is provided a semiconductor device excellent in reliability. The semiconductor device is comprised of a semiconductor substrate, an insulating portion having a multilayer insulating film composed of an etch stopper film, an insulating film, an etch stopper film, an insulating film, an etch stopper film and an insulating film provided on an upper portion of the semiconductor, fuses provided on the insulating portion, and a seal ring composed of a copper containing metal film, a barrier metal film, a copper containing metal film and a barrier metal film embedded in the insulating portion so as to surround a region just below the fuses.

13 Claims, 17 Drawing Sheets

FUSE AND SEAL RING

This application is based on Japanese patent application NO. 2004-101882, the content of which is incorporated hereinto by reference.

BACKGROUND OF THE INVENTION

1. Field of the Invention

The present invention relates to a semiconductor device and a method for manufacturing the same.

2. Related Art

In recent years, the semiconductor device with a fuse is energetically developed with the objective of an improvement of reliability and manufacturing stability of the semiconductor device. As this kind of technique, there is one described in the Japanese Laid-Open Patent Publication No. 2003-209173. FIG. 16 is a schematic sectional view showing the conventional fuse structure described in the Japanese Laid-Open Patent Publication No. 2003-209173.

The fuse structure is comprised of a circuit portion 2120 having a multilayered interconnect structure and a fuse portion 2110 including a plurality of fuses 220, which are irradiated with a laser beam and melted by an irradiation of the laser beam. The circuit portion 2120 and the fuse portion 2110 both are formed on a silicon substrate 210.

Interlayer insulating films 232, 234, 236 and 238 composed of a silicon oxide film or the like are formed on the silicon substrate 210 in this order from the silicon substrate 210 side. A first protective layer 240 and a second protective layer 242 composed of a silicon nitride film or the like are formed between the interlayer insulating film 236 and the interlayer insulating film 238. Pluralities of fuses 220 are formed between the first protective layer 240 and the second protective layer 242. A passivation film 280 composed of the silicon nitride film or the like is further formed on the interlayer insulating film 238.

The circuit portion 2120 is provided with interconnect layers 260, 270. Transistors composed memories or the like or another elements (not shown in the drawings) are connected to the interconnect layers 260, 270. The interconnect layer 260 is formed on the interlayer insulating film 234. The interconnect layer 270 is formed on the second protective layer 242.

The plurality of fuses 220 is provided on the second protective layer 242 in the fuse portion 2110. A plurality of an interconnect layer 250 is provided on an element isolation region 212. The fuse portion 2110 provided with an opening 216 of the passivation film 280.

According to the Japanese Laid-Open Patent Publication No. 2003-209173, there is described that, based on this configuration, in the case where the fuse is melted by the irradiation of the laser beam, it is possible to suppress intrusion of moisture or impurity upon providing the first protective layer 240 and the second protective layer 242 above and below the fuse 220 respectively.

On the other hand, there is the Japanese Laid-Open Patent Publication No. 2003-086590, which differs from the semiconductor device according to the present embodiment in the technical field, disclosing the seal ring structure surrounding a semiconductor element with the objective of suppressing intrusion of moisture or impurity. The Japanese Laid-Open Patent Publication No. 2003-086590 describes of providing the seal ring between the memory portion and the fuse portion so as to surround the memory portion. There will be described about the Japanese Laid-Open Patent Publication No. 2003-086590 later in detail.

SUMMARY OF THE INVENTION

However, it has now been discovered that the related art described in the above literature has still room for improvement with respect to the following point.

Firstly, even though the fuse is made to protect by the first protective layer 240 and the second protective layer 242 composed of the silicon nitride film or the like, on the occasion when the fuses are irradiated with the laser beam and melted by the irradiation of the laser beam, in some cases, also the first protective layer 240 and the second protective layer 242 around the fuses suffer damage. At this time, in some cases, moisture or humidity intrudes into the interlayer insulating films 232, 234, 236 or the like from the damaged portion.

Secondly, in some cases, the effect for preventing intrusion of moisture or humidity with the first protective layer 240 and the second protective layer 242 composed of the silicon nitride film or the like is not sufficient. That is, in some cases, moisture or humidity intrudes into the interlayer insulating films 232, 234, 236 or the like, by passing through the first protective layer 240 and the second protective layer 242, when the first protective layer 240 and the second protective layer 242 can not prevent the passage of moisture or humidity.

For this reason, in some cases, properties of the wiring layers 250, 260, 270 or the like deteriorate caused by moisture or humidity intruded, while passing through the damaged portion, or while passing through the protective layer. Consequently, the related art described in the above literature has still room for improvement in respect of reliability.

According to the present invention, there is provided a semiconductor device comprising a semiconductor substrate, an insulating portion, which is provided over the semiconductor substrate, having not less than two layers of interlayer insulating films, a fuse provided on the insulating portion, and a seal ring embedded in the insulating portion so as to surround a region just below the fuse.

According to the present invention, the seal ring is embedded in the insulating portion having not less than two layers of the interlayer insulating films so as to surround the region just below the fuse, therefore, it is possible to suppress that moisture or humidity, which is intruded from a damaged portion such as the interlayer insulating film or the like when the fuse is irradiated with the laser beam and melted by the laser irradiation, leaks to outside of the seal ring. For this reason, it is possible to suppress deterioration of a function of the circuit element upon arranging the circuit element or the like to outside of the seal ring. Consequently, according to this configuration, the semiconductor device that is excellent in reliability can be obtained.

Further, according to the present invention, there is provided a semiconductor device comprising a semiconductor substrate, an insulating portion provided over the semiconductor substrate, a fuse provided on the insulating portion, and a seal ring embedded in the insulating portion so as to surround the region just below the fuse, wherein an inside surface of the seal ring is composed of a high melting point metal containing film.

According to the present invention, the seal ring having the inside surface composed of the high melting point metal containing film so as to surround the region just below the fuse is embedded in the insulating portion, on the occasion when the fuse is irradiated with the laser beam and melted by the laser irradiation, it is possible to suppress that moisture or humidity, which is intruded from the damaged portion such as the interlayer insulating film or the like caused by the laser irradiation, leaks to outside of the seal ring. For this reason, it is possible to suppress deterioration of a function of the circuit element upon arranging the circuit element or the like at outs-de of the seal ring. Consequently, according to this configuration, the semiconductor device that is excellent in reliability can be obtained.

Further, according to the present invention, there is provided a method for manufacturing a semiconductor device comprising: forming a first insulating film on a semiconductor substrate, forming a first trench in the first insulating film so as to surround a predetermined region, forming a first high melting point metal containing film, which is provided at a portion of inside of the first trench, covering an inner face of the first trench, forming a first copper containing metal film at a remaining part of the inside of the first trench, forming a second insulating film on the first insulating film, forming a second trench in the second insulating film on the first trench so as to surround the predetermined region, forming a second high melting point metal containing film, which is provided at a portion of the inside of the second trench, covering an inner face of the first trench, forming a second copper containing metal film at a remaining part of the inside of the second trench, and forming a fuse on the second insulating film so as to be included in the predetermined region on the second insulating film.

According to the present invention, there is stably obtained the semiconductor device provided with a configuration in which the seal ring provided with the high melting point metal containing film at the inside surface is embedded in the insulating portion having not less than two layers of the interlayer insulating film so as to surround the region just below the fuse. For this reason, on the occasion when the fuse is irradiated with the laser beam and melted by the laser irradiation, it is possible to suppress that moisture or humidity, which has been intruded from the damaged portion such as the interlayer insulating film or the like, leaks to outside of the seal ring. Consequently, it is possible to suppress deterioration of a function of the circuit element upon arranging the circuit element or the like at outside of the seal ring. Consequently, according to this method, it is possible to manufacture the semiconductor device that is excellent in reliability.

As above, although there is described the constitution of the present invention, constitution arbitrarily combined by these compositions is effective as the embodiment of the present invention.

For instance, although the above seal ring is embedded in the insulating portion so as to surround the region just below the fuse, it is not necessary to surround the whole interlayer insulating film included in the insulating portion just below the fuse. For instance, in cases where the insulating portion has not less than three layers of interlayer insulating films, the interlayer insulating films up to the second layer from the first layer just below the fuse is made to surround, and the interlayer insulating film equal to or lower than the third layer may not be made to surround. Of course, in order to improve the sealing property of moisture or humidity by the seal ring, it is effective that also the interlayer insulating film equal to or lower than the third layer is made to surround by the seal ring.

According to the present invention, there is provided with the configuration where the seal ring is embedded in the insulating portion so as to surround the region just below the fuse, therefore, the semiconductor device that is excellent in reliability is obtained.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
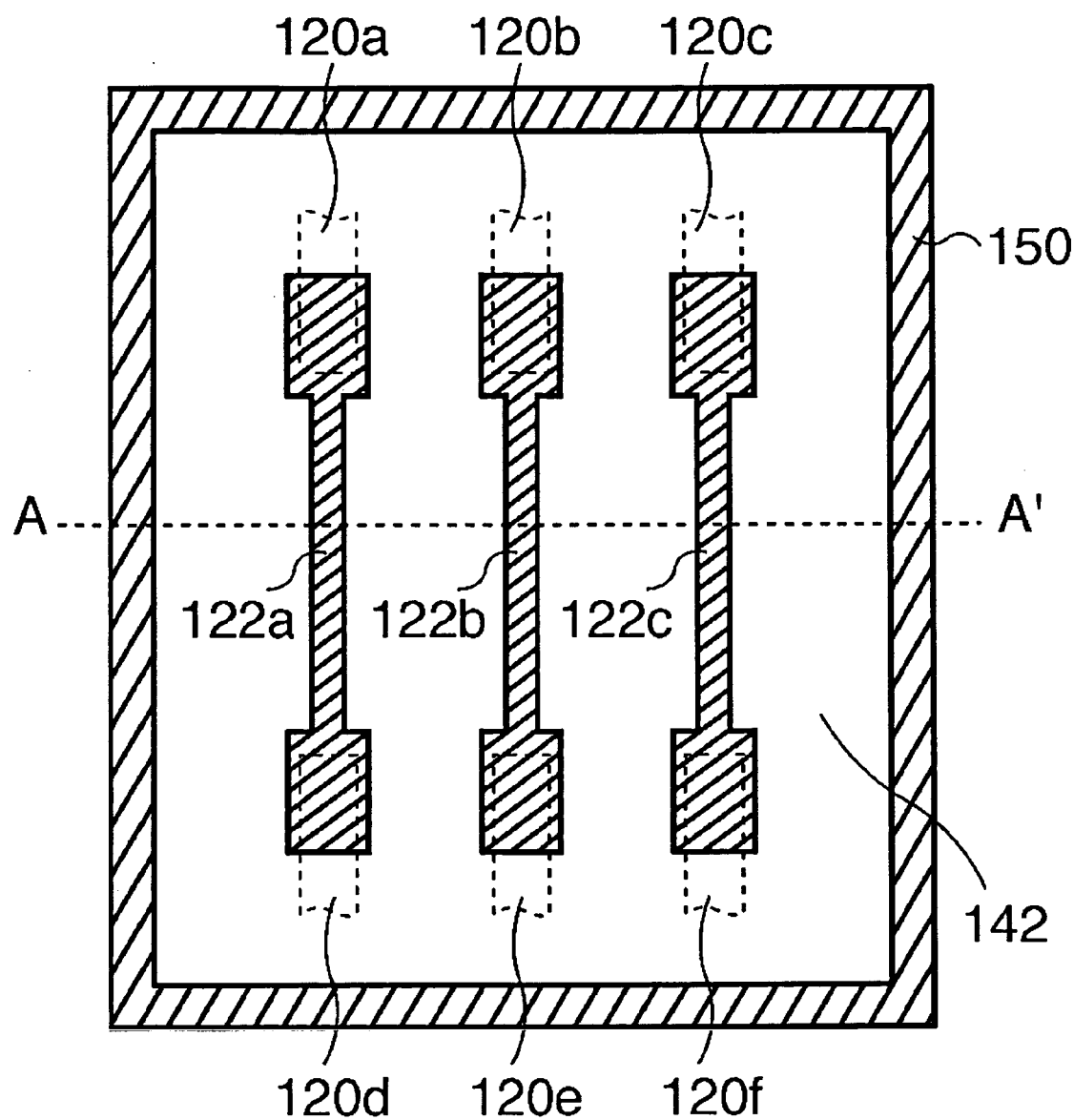
FIG. 1 is a plan view schematically showing a semiconductor device provided with a seal ring structure of a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposed.

In the present invention, an inside surface of the seal ring may be composed of a film containing not less than one kind selected from a group composed of Ta, TaN, Ti, TiN, W, WN, Mo, Cr and Ni.

According to this configuration, the inside surface of the above described seal ring is composed of a film containing materials capable of suppressing intrusion of moisture or humidity; therefore, on the occasion when the fuse is irradiated with the laser beam and melted by the irradiation of the laser beam, it is possible to suppress that moisture or humidity, which intrudes from a damaged portion such as the interlayer insulating film or the like, leaks to outside of the seal ring.

Further, the above described seal ring may comprise not less than one copper containing metal film and not less than one high melting point metal film, which respectively covers an each inside surface, an outside surface and a bottom surface of the copper containing metal film.

According to this configuration, the above described seal ring is capable of suppressing intrusion of moisture or humidity with three high melting point metal films provided for three places of the inside surface, the outside surface and the bottom surface of the copper containing metal film, therefore, it is possible to further effectively suppress that moisture or humidity leaks to outside of the seal ring.

Further, the above described fuse may be composed of a high melting point metal containing film.

According to this configuration, the above described fuse is irradiated with the laser beam and easily melted by the irradiation of the laser beam, and which is composed of the high melting point metal containing film that is excellent in conductivity, therefore, the fuse is capable of being suitably used as the fuse.

Further, the above described fuse may be composed of a film containing not less than one kind selected from a group composed of Ti, TiN, Ta, TaN, W, Mo, Cr and Ni.

In such a manner as above, the above described fuse is irradiated with the laser beam and easily melted by the laser irradiation, and is composed of films containing materials that is excellent in conductivity, therefore, the fuse is capable of being suitably used as the fuse.

Further, the above described semiconductor device may further comprise a protective insulating film, which is provided so as to cover an upper face of the fuse, containing a SiN film or a SiON film.

According to this configuration, the protective insulating film including films made of materials for suppressing intrusion of moisture or humidity covers the upper face of the fuse, therefore, it is suppressed that moisture or humidity intrudes into the region of an inside portion of the seal ring below the fuse.

Further, the above described insulating portion may comprise not less than two layers of interlayer insulating films, and an etch stopper film containing a SiN film or a SiON film provided between the not less than two layers of interlayer insulating films.

According to this configuration, also on the occasion when the fuse is irradiated with the laser beam and melted by the irradiation of the laser beam, the etch stopper film including the films made of materials suppressing intrusion of moisture or humidity is provided between the interlayer insulating films, therefore, it is possible to suppress that moisture or humidity, which has been intruded from the damaged portion such as the interlayer insulating film of the upper layer, leaks toward the interlayer insulating film of the lower layer.

Further, the above described insulating portion may comprise not less than two layers of interlayer insulating films and an etch stopper film containing a SiN film or a SiON film provided just below an interlayer insulating film of an uppermost layer among not less than two layers of interlayer insulating films.

According to this configuration, the more the uppermost layer of the etch stopper film into which moisture or humidity is easy to intrude, the more excellent material in function to suppress intrusion of moisture or humidity is selected, therefore, it is possible to effectively suppress that moisture or humidity, which has been intruded from the damaged portion such as the interlayer insulating film of the uppermost layer, further leaks toward the interlayer insulating film of the lower layer.

Further, the above described insulating portion may comprise not less than two layers of interlayer insulating films, and a thickness of a high melting point metal containing film of an inside surface of the seal ring embedded in an interlayer insulating film of an uppermost layer among the insulating portion, is larger than a thickness of the high melting point metal containing film of the inside surface of the seal ring embedded in an interlayer insulating film, which is lower than the uppermost layer among the insulating portion.

According to this configuration, it is possible to more effectively suppress that moisture or humidity leaks toward outside of the seal ring. Because the thickness of the high melting point metal containing film of the inside surface of the seal ring of the uppermost layer into which moisture or humidity is easy to be intruded is made to large.

Further, the above described seal ring may have a notch portion.

According to this configuration, it is possible to suppress that eddy current is generated in the seal ring, so that it is possible to suppress that a magnetic field, which passes through the semiconductor substrate, is generated caused by the eddy current, therefore, dielectric characteristics of the semiconductor device is improved.

Further the above described semiconductor device may be capable of being constituted that, in a vicinity of outside of the notch portion of the seal ring, a part, which has the same structure as the seal ring and correspond to a portion of the seal ring, is arranged at least so as to cover the notch portion.

According to this configuration, it is possible to suppress that moisture or humidity leaks to outside of the seal ring from the notch portion of the seal ring, upon being further arranged the high melting point metal containing film.

Further, the above described seal ring may be embedded in the insulating portion so as to surround a region just below the fuse with the region not less than doubly surrounded.

According to this configuration, the above described seal ring is capable of effectively suppress intrusion of moisture or humidity by double structure, therefore, it is possible to further effectively suppress that moisture or humidity leaks toward outside of the seal ring.

Hereinafter, there will be described the embodiment of the present invention with reference to accompanying drawings. It should be noted that, in the whole drawings, the same marks are added to the same constitution elements to omit the explanation appropriately.

First Embodiment

FIG. 1 is a plan view schematically showing a semiconductor device provided with a seal ring structure of an embodiment. The semiconductor device according to the present embodiment is provided with fuses 122a, 122b, and 122c composed of high melting point metal films such as Ta or TaN or the like.

The fuse in the present embodiment means a structure for disconnecting wires connected to both end portions where a fine wire portion of the center portion is irradiated with the laser beam and melted by the irradiation of the laser beam. For that reason, the fuse is constituted with the high melting point metal film, which is easy to absorb the laser beam, having excellent conductivity.

The line width in the laser irradiating region corresponding to the center portion of these fuses 122a, 122b, and 122c is fine in which the line width may be made to be, for instance, degree of 0.5 μm to 1.6 μm. Both ends of the fuses 122a, 122b, and 122c, which are wider than the line width in the laser irradiating region, in the both ends, are connected to copper wirings 120a, 120b, 120c, 120d, 120e, and 120f provided within the interlayer insulating film just below the both ends portions.

Figure 2:
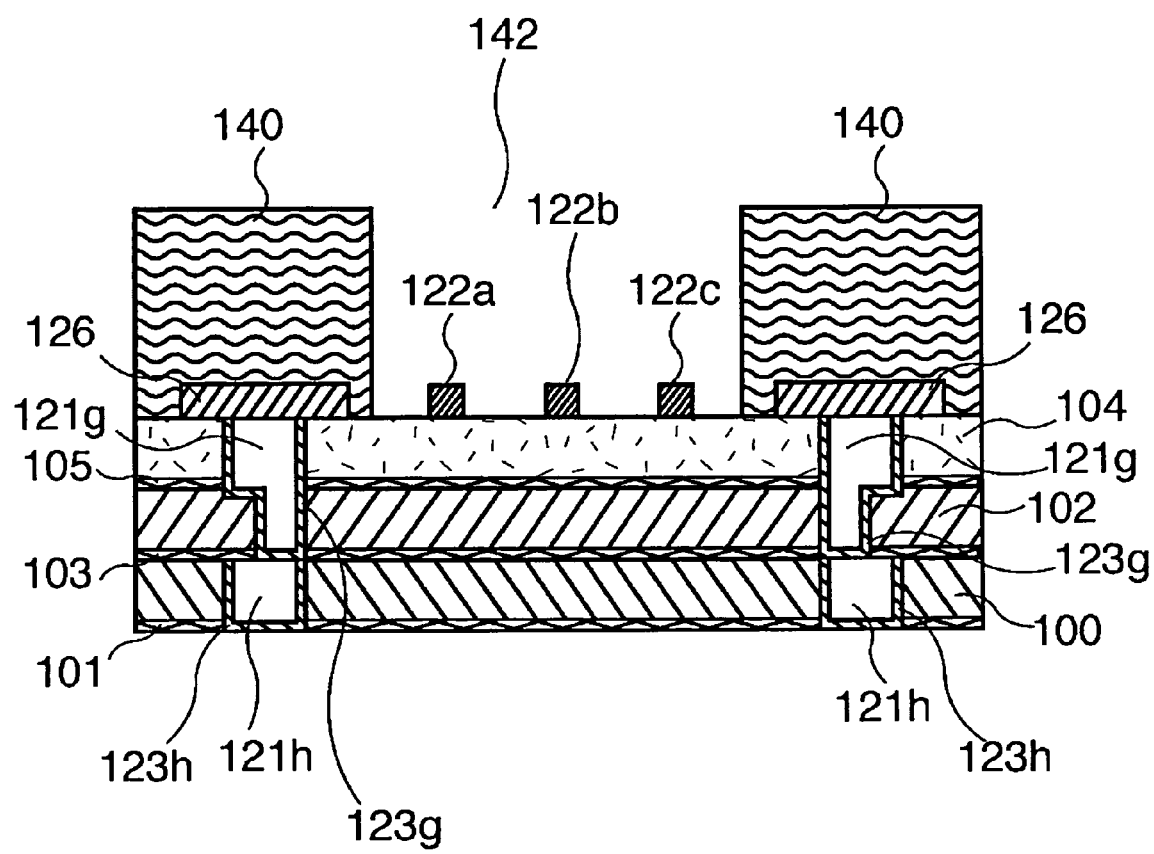
FIG. 2 is a sectional view schematically showing the semiconductor device provided with the seal ring structure of the first embodiment.

Further, as shown in FIG. 2 described later, there is provided a fuse window 142 at which a cover film 140 does not reside, in a region where a film width of the high melting point metal film of the center portion of the fuses 122a, 122b and 122c becomes narrow.

Further, there is provided a seal ring 150 whose constitution described later, within the interlayer insulating film below the fuses 122a, 122b and 122c so as to surround the region just below the fuses 122a, 122b and 122c.

FIG. 2 is a sectional view schematically showing the semiconductor device provided with the seal ring structure of the embodiment. FIG. 2 corresponds to a sectional view in the case of cutting along the A-A' line of FIG. 1. The semiconductor device according to the present embodiment has structure constituted by forming the insulating films 100, 102 and 104 composed of $SiO_2$ film or the like in this order over the semiconductor substrate (not shown in the drawings) such as the silicon substrate or the like.

There is provided an etch stopper film 101 composed of a SiC film or a SiCN film at a lower part of the insulating film 100. There is provided an etch stopper film 103 composed of a SiC film or a SiCN film between the insulating film 100 and the insulating film 102. There is provided an etch stopper film 105 composed of a SiN film or a SiON film between the insulating film 102 and the insulating film 104. Originally, if the etch stopper film 101 and the etch stopper film 103 are constituted by comprising a SiN film or a SiON film, as described later, it is advantageous in respect of waterproof property.

Further, the copper containing metal film 121h is embedded in a ring shape within the insulating film 100. An inside surface, an outside surface, and a bottom surface of the copper containing metal film 121h are covered by a barrier metal film 123h composed of the high melting point metal film containing W or TiN or the like. FIG. 2 is a sectional view, therefore, there is laterally illustrated the copper containing metal film 121h and the barrier metal film 123h, however, these are respectively the same members with the ring shape.

Further, the copper containing metal film 121g is embedded in the insulating film 102 and the insulating film 104 in a ring shape. An inside surface, an outside surface and a bottom surface of the copper containing metal film 121g are covered by a barrier metal film 123g composed of the high melting point metal film containing W or TiN or the like. FIG. 2 is a sectional view, therefore, there is laterally illustrated the copper containing metal film 121g and the barrier metal film 123g, however, these are respectively the same members with the ring shape.

The seal ring 150 shown in FIG. 1 is constituted by a member having configuration similar to a ring shaped wiring of a lower layer including the copper containing metal film 121h and the barrier metal film 123h, and a part having configuration similar to a ring shaped wiring of an upper layer including the copper containing metal film 121g and the barrier metal film 123g. The inside surface of the barrier metal film 123h and the barrier metal film 123g form a wall shaped structure composed of the high melting point metal film continuing in the direction parallel to the interlayer insulating film.

Further, the inside surface of the barrier metal film 123h and the barrier metal film 123g form a wall shaped structure composed of the high melting point metal film continuing also up and down with penetrating the insulating films 100, 102 and 104. Further, irregularity of a joint of the inside surface of these barrier metal film 123h and the barrier metal film 123g is small, as a whole, they are approximately flush with each other. As a result, the region just below the fuses 122a, 122b and 122c becomes structure covered with the barrier metal film 123h and the barrier metal film 123g provided in a mural shape.

A seal ring upper portion film 126 composed of the high melting point metal film is provided in an upper portion of the above described copper containing metal film 121g and the barrier metal film 123g. It is preferable that the high melting point metal film may contain Ta, TaN, Ti, TuN, W, WN, Mo, Cr and Ni.

The seal ring upper portion film 126 has a ring shape. Further, a cover film 140 composed of a polyimide film or the like is formed so as to cover the seal ring upper portion film 126. On the cover film 140, there is provided fuse windows 142 in the region where the fuses 122a, 122b and 122c are provided.

In the upper portion of the region surrounded by the seal ring, a plurality of fuses 122a, 122b and 122c composed of the high melting point metal film containing W or TiN or the like are provided.

Figure 17:
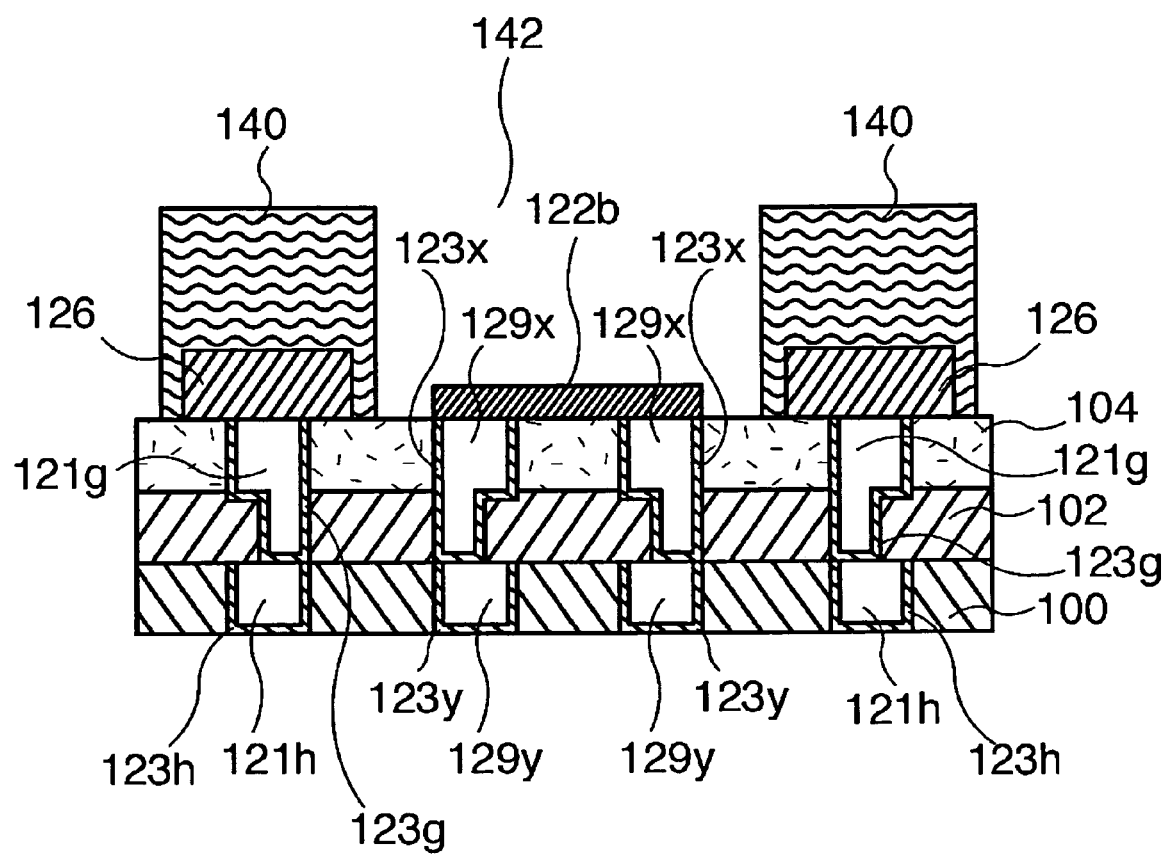
FIG. 17 is a sectional view schematically showing, from another angle, the semiconductor device provided with the seal ring structure of the first embodiment.

FIG. 17 is a sectional view schematically showing the semiconductor device from another angle that is provided with the seal ring structure of the first embodiment. Specifically, it is the sectional view along the line perpendicular to A-A' line of the plan view of FIG. 1.

In the semiconductor device according to the present embodiment, there is provided a copper interconnect for connecting with the fuse 122b at the regions just below the both end portions of the fuse 122b. Both of these copper interconnects, which reach at a lower layer than the insulating layer on which a lower end of the seal ring is provided, are connected to the elements provided at outside of the seal ring, while passing through a lower part of the seal ring.

Part of these copper interconnects is composed of a copper containing metal film 129x embedded in the insulating films 104 and 102, and a barrier metal film 123x including TiN or W or the like embedded in the insulating films 104 and 102, and a copper containing metal film 129y embedded in the insulating film 100, and a barrier metal film 123y including TiN or W or the like embedded in the insulating film 100.

The surface of these copper interconnects is covered by the barrier metal films 123x, 123y containing TiN or W or the like, therefore, even though a damaged portion occurs at the insulating film 104 caused by the laser irradiation to the fuse 122b and thereby moisture intrudes to the insulating films 104, 102 and 100 and the like, it is possible to suppress corrosion of the copper containing metal films 129x, 129y.

Hereinafter, there will be described action and effect in accordance with constitution of the present embodiment.

Figure 3:
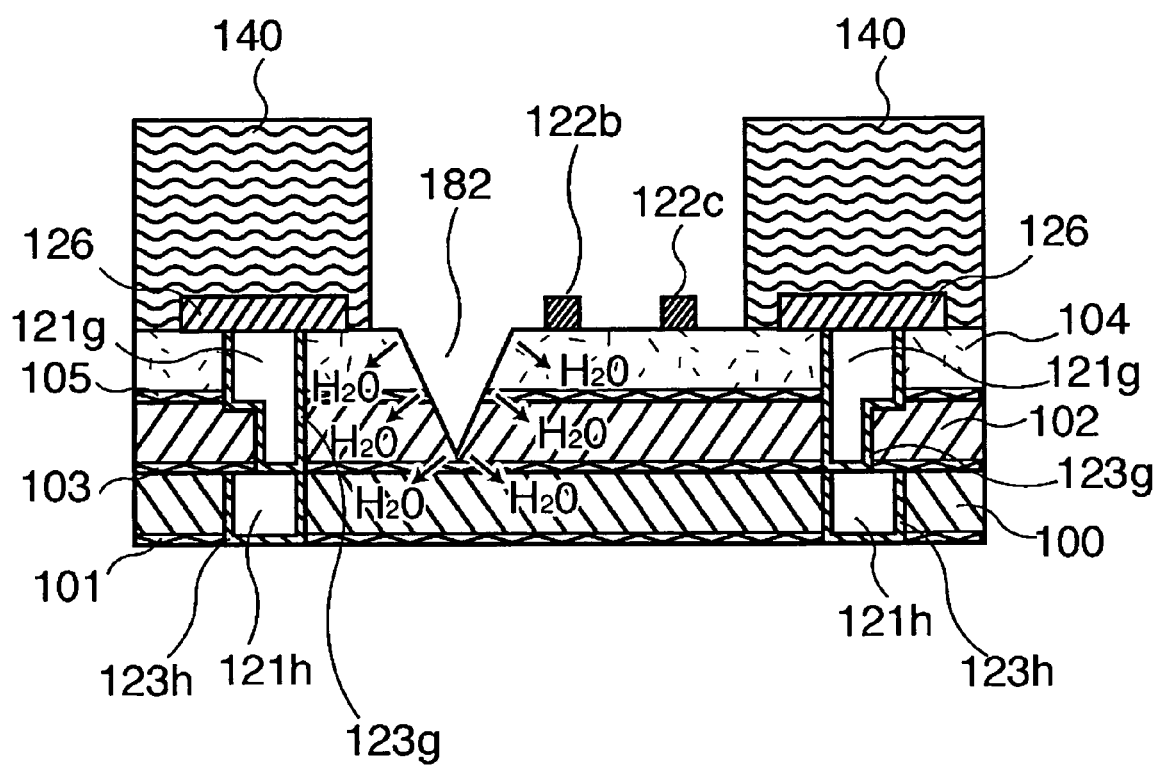
FIG. 3 is a sectional view schematically showing a seal function in the semiconductor device provided with the seal ring structure of the first embodiment.

FIG. 3 is a sectional view schematically showing sealing property in the semiconductor device provided with the seal ring of the embodiment.

The semiconductor device according to the present embodiment is a semiconductor device, so-called, using a fuse for trimming; and the semiconductor device is constituted by surrounding periphery of the insulating portion of the lower portion of the fuse element by only the uppermost layer Cu interconnect shape structure or by Cu interconnect shape structure stretched under the uppermost layer Cu interconnect shape structure.

In the semiconductor device according to the present embodiment, there is no semiconductor element below the fuse, and periphery of the insulating portion of the lower portion of the fuse element is surrounded by the sealing structure composed of the uppermost layer Cu interconnect shape structure and the Cu interconnect shape structure stretched under the uppermost layer Cu interconnect shape structure.

On the occasion of performing trimming, the fuse is made to cut with laser, at this time, the interlayer film below the fuse is damaged (resulting in scratch). In the case where moisture in the air is intruded from the scratch, if the moisture reaches at circuit elements or interconnects or the like other than the fuse element, it causes increase of leak of the interconnect interlayer film, or it causes reliability of Cu interconnect to deteriorate.

In this respect, as the present embodiment, it is possible to block intrusion of the moisture upon providing the seal ring comprised of single or a plurality of the Cu interconnect shape structure at periphery of the insulating portion of the lower portion of the fuse element.

In the semiconductor device according to the present embodiment, when the fuse 122a is irradiated with the laser beam or the like and melted by the laser irradiation or the like, in some cases, a damaged portion 182 occurs on the insulating film 104 and the insulating film 102 composed of a SiO₂ film corresponding to a lower portion of the fuse 122a. As a result, in some cases, moisture or humidity intrudes inside of the insulating film 104 and the insulating film 102 composed of the SiO₂ film or the like form the damaged portion 182. Further, in cases where low dielectric constant film is used as the insulating film 104 and the insulating film 102, moisture or humidity is easy to intrude the insulating film 104 and the insulating film 102 from the damaged portion 182 because the low dielectric constant film has relatively high moisture permeability, and relatively high hygroscopic property.

When moisture comes into contact with the interconnect including the copper containing metal film or the like, or the circuit element or the like while the moisture intruding from outside, in some cases, characteristic change or corrosion of the interconnect or the circuit element or the like occurs. Further, in the case that so-called Low-k film to be the insulating film with lower dielectric constant than a dielectric constant of the silicon oxide film is used, in some cases, long term reliability of the semiconductor device deteriorates, when moisture has intruded the Low-k film, a capacity between interconnects of the Low-k film increases, a crosstalk between the interconnects increases.

However, in the semiconductor device according to the present embodiment, there is provided the seal ring comprised of the copper containing metal film 121h, the barrier metal film 123h, the copper containing metal film 121g, and the barrier metal film 123h and the like so as to surround a multilayered insulating film composed of the insulating film 104, the insulating film 102 and the insulating film 100 and the like of the region just below the fuses 122a, 122b and 122c. Here, the above described barrier metal film is not limited to the film containing Ta, TaN, but it may be a film containing TiN, TiW, WN. The barrier metal film may be one, which has diffusion prevention effect of copper and becomes stable film even though when being oxidized.

Here, in the semiconductor device according to the present embodiment, the copper containing metal film of the seal ring portion or the barrier metal film of periphery of the copper containing metal film suppresses intrusion of moisture to the outside of the seal ring provided with the circuit elements or the interconnect, therefore, the above described effect can be obtained. Originally, the barrier metal film such as TaN or the like to cover periphery of the copper containing metal film is more excellent in function to seal actually moisture or humidity than the copper containing metal film. In some case, the copper containing metal film is oxidized when moisture is intruded, however, the barrier metal film such as TaN or the like is difficult to be oxidized, therefore, that is excellent in function to serve roll of waterproof property.

Further, the inside surface of the barrier metal film 123h and the barrier metal film 123g forms mutually a successive annular wall shaped structure composed of the high melting point metal film. For this reason, moisture or humidity, which has been intruded from the damaged portion 182, is stopped by the barrier metal film 123h and the barrier metal film 123g, so that leakage of moisture or humidity to outside of the seal ring is suppressed.

Further, the inside surface of the barrier metal film 123h and the barrier metal film 123g penetrates through not less than two layers of the interlayer insulating films 100, 102 and 104 counted from the uppermost layer just below the fuses 122a, 122b and 122c, and surrounds at least portion of the region just below the fuses 122a, 122b and 122c. For this reason, even though moisture intrudes the interlayer insulating film 102, 104 of not less than second layer counted from the uppermost layer, it is possible to suppress leakage of moisture toward outside of the seal ring.

Further, both side surfaces and the bottom surface of the copper containing metal films 121h, 121g are respectively covered by the barrier metal films 123h, 123g. For this reason, moisture or humidity on the inside of the seal ring is stopped by the copper containing metal film of three positions of the inside surface, the bottom surface and the outside surface of the copper containing metal film. For this reason, leakage of the moisture or the humidity toward the outside of the seal ring is further effectively suppressed.

Further, in cases where the fuse 122 is melted with the laser irradiation, as shown in FIG. 3, in some cases, not only the insulating film 104, but also the insulating film 102 is damaged. However, in the present embodiment, the seal ring is provided across not less than three layers of the interlayer insulating films counted from the uppermost layer. For this reason, even when moisture or humidity is intruded into the insulating film 102 of the second layer and the insulating layer 100 of the third layer, leakage of the moisture or the humidity to the outside of the seal ring is suppressed.

Here, in recent years, in many cases, a Low-k film with high hygroscopic property is used as the interlayer insulating film. As the Low-k film, a ladder OX film, a SiOC film, a SiCN film or the like are indicated. When these Low-k films absorb moisture, capacity between the interconnects increases, followed by increasing crosstalk between interconnects, therefore, reliability of the semiconductor device deteriorates.

On the contrary, the semiconductor device according to the present embodiment is provided with an etch stopper film 105 composed of a SiN film or a SiON film or the like. The etch stopper film 105 has more excellent effect to suppress intrusion of moisture or humidity than the interlayer insulating films 100, 102 and 104 composed of a $SiO_2$ film or the like. For this reason, it is possible to suppress intrusion of moisture or humidity from the interlayer insulating film of the upper layer to the interlayer insulating film of the lower layer in such a way as above. That is, it is effective to form the bottom portion of the insulating film of the uppermost layer with a SiON film, a SiN film or the like, which are difficult to pass through water from the viewpoint of waterproof property.

Consequently, that all of the etch stopper film 101, the etch stopper film 103 and the etch stopper film 105 is made to be a SiN film or a SiON film is effective from the viewpoint of waterproof property.

Thus, an effect to suppress intrusion of moisture or humidity is capable of being obtained upon providing a SiN film, a SiON film or the like as the etch stopper film. At this time, a thickness of the etch stopper film may be made to be, for instance, not less than 30 nm to not more than 120 nm. If the film thickness of the etch stopper film is within this range, it is possible to obtain a miniaturized semiconductor device having excellent waterproof property.

For this reason, according to such configuration, there is provided a SiN film or a SiON film that is excellent in effect to suppress intrusion of moisture or humidity as the etch stopper film 105 of the upper layer with many possibilities of intrusion of moisture or humidity, therefore, it is possible to further effectively suppress intrusion of moisture or humidity from the interlayer insulating film of the upper layer to the interlayer insulating film of the lower layer.

Further, according to this configuration, as described later, the seal ring is capable of being manufactured by a usual manufacturing method of the semiconductor device with a multilayered interconnect structure of the so-called a dual damascene structure, therefore, it is possible to manufacture the semiconductor device of the present embodiment according to the same manufacturing process as that of another member of the semiconductor device. For this reason, manufacturing stability of the semiconductor device is improved.

Further, the semiconductor device according to the present embodiment is capable of having a structure providing the multilayered interconnect structure or the circuit elements on the outside of the seal ring.

According to this configuration, leakage of moisture or humidity to the outside of the seal ring is suppressed, therefore, it is possible to suppress increase of the crosstalk between the interconnects, while suppressing deterioration of characteristics of the multilayered interconnect structure or the circuit element or the like on the outside of the seal ring, or increase of the capacity between the interconnects of the multilayered insulating film. Consequently, the semiconductor device that is excellent in long-term reliability is capable of being obtained.

Figure 15:
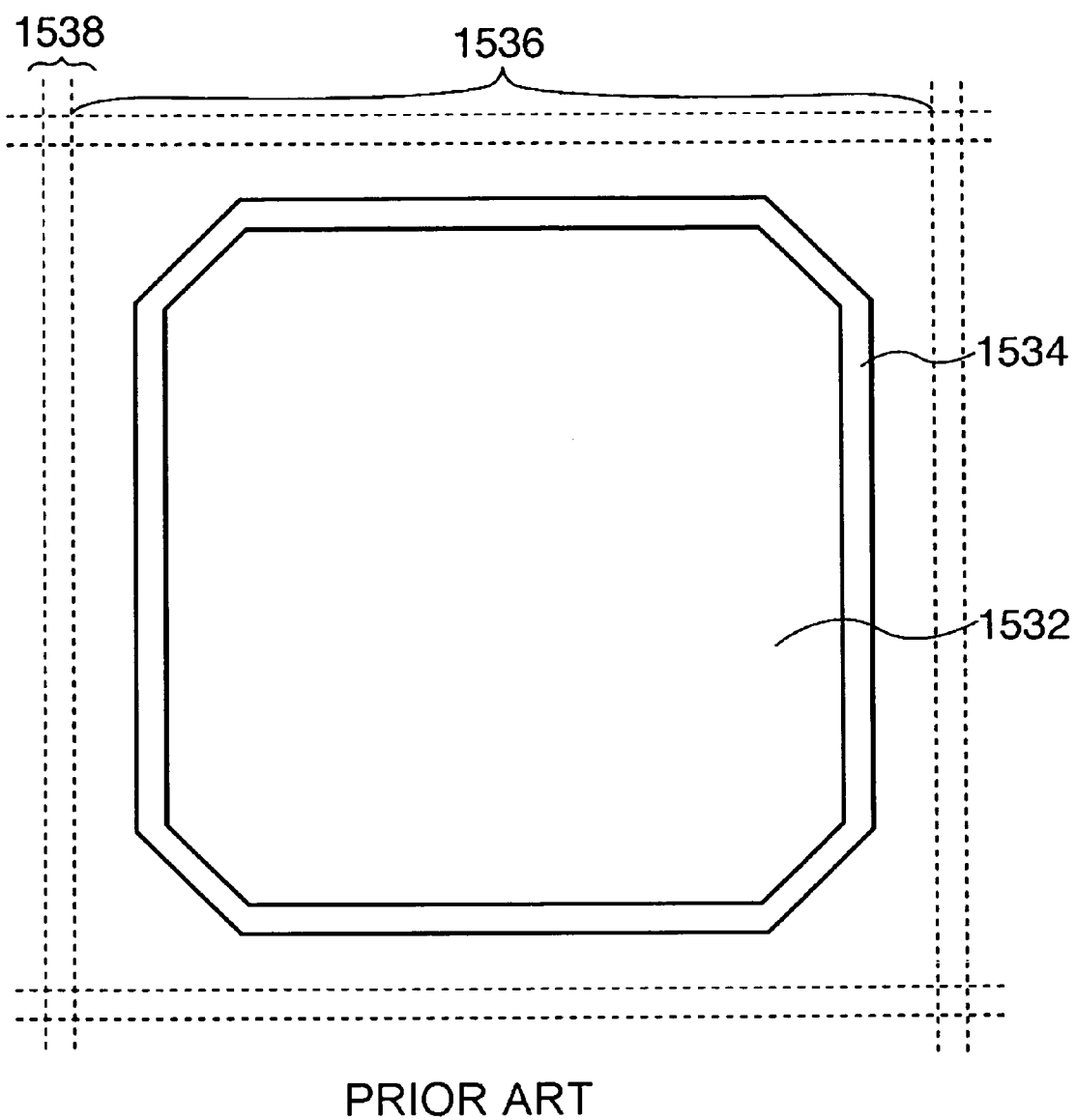
FIG. 15 is a plan view schematically showing the semiconductor device provided with a conventional seal ring structure.
Figure 16:
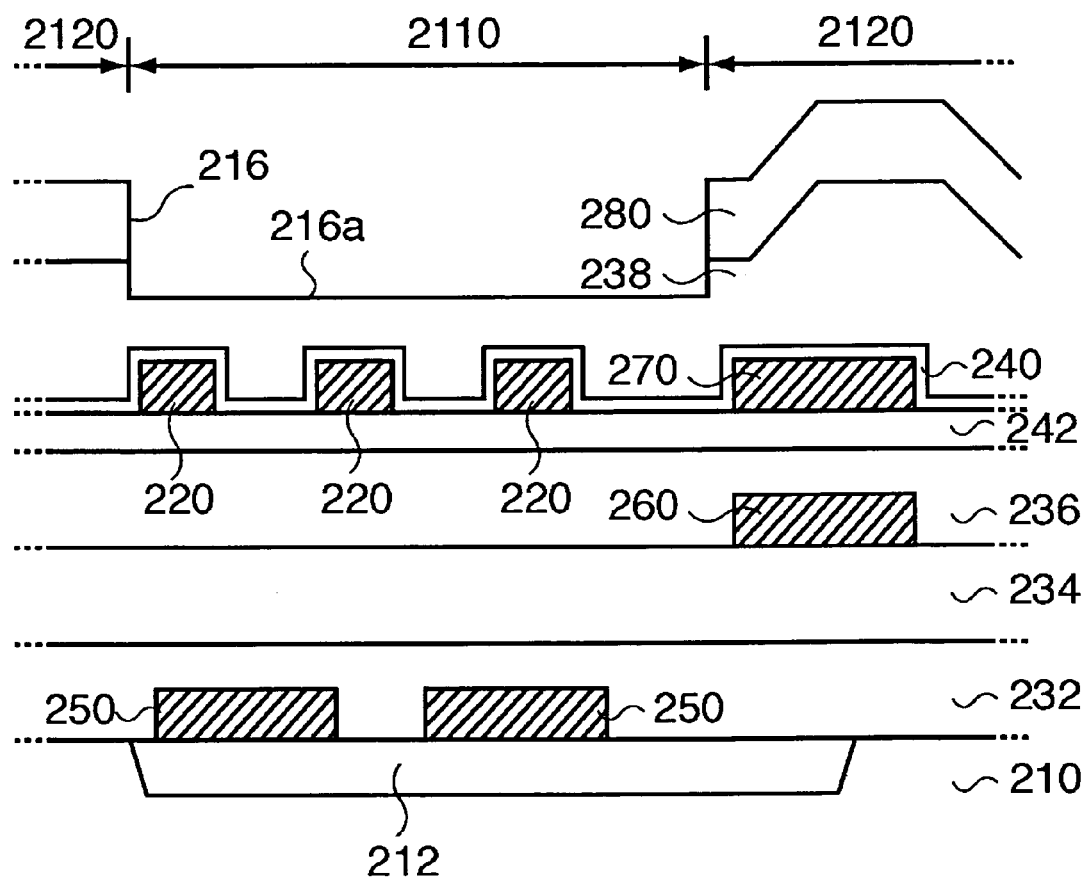
FIG. 16 is a sectional view schematically showing the semiconductor device provided with the conventional fuse structure.

On the other hand, FIG. 15 is a plan view schematically showing the conventional seal ring structure described in the Japanese Laid-Open Patent Publication No. 2003-086590. In this semiconductor device, the seal ring 1534 is provided so as to surround an internal element region 1532.

These internal element region 1532 and a seal ring 1534 are provided in a chip region 1536. Further, a scribe region 1538 surrounds the chip region 1536. A fuse portion, not shown in the drawings, is provided on the outside of the seal ring 1534 in the chip region 1536.

However, the technique described in the literature is technique in which there is provided the seal ring so as to surround a memory portion to be protected from the damaged portion, which occurs caused by conducting a laser irradiation to the fuse portion.

That is, the technique described in the literature is technique to protect the semiconductor element on the inside of the seal ring from moisture of the outside of the seal ring. Therefore, there is adopted configuration providing the seal ring at the periphery portion of the semiconductor element in order to suppress intrusion of moisture from the lateral direction of a dicing line. Consequently, to provide the seal ring at the internal region of the semiconductor element is not intended. Consequently, the seal ring structure has not configuration capable of integrating with the structure of the internal region of the semiconductor element or the manufacturing process.

On the other hand, the technique according to the present embodiment is technique to protect the circuit element on the outside of the seal ring from moisture of the inside of the seal ring. Consequently, there is adopted configuration providing the seal ring so as to surround the region just below the fuse. The configuration is to protect the circuit element on the outside of the seal ring from intrusion of moisture intruded from the damaged portion of the interlayer insulating film, which is, in some cases, damaged caused by the laser irradiation toward the fuse. Accordingly, the seal ring should be provided on the internal region of the semiconductor element. Consequently, in this respect, the seal ring of the present embodiment has a configuration capable of integrating with the structure of the internal region of the semiconductor element or the manufacturing process.

For instance, the seal ring of the present embodiment has a structure formed so as to pile up the interconnect shaped structure. Further, dimensions of these interconnect shaped structure are capable of being made to be the same dimension of the interconnect included in the multilayered interconnect structure on the outside of the seal ring. For this reason, the seal ring with the interconnect shaped structure is capable of being manufactured with the same manufacturing process as the multilayered interconnect structure, so that the seal ring of the present embodiment is capable of integrating with the structure of the internal region of the semiconductor element or the manufacturing process.

Consequently, the technique of the present embodiment is completely different from the technique described in the Japanese Laid-Open Patent Publication No. 2003-086590 in that constitution of the medium to solve the problem totally differs from that described in the literature. The semiconductor device of the present embodiment is constituted by providing the seal ring so as to surround the multilayered insulating film on the lower portion of the fuse in order to protect the interconnect or the circuit element to be protected from the damaged portion, which occurs caused by the laser irradiation to the fuse.

Further, the related art described in the above literature has still room for improvement with respect to the following point.

Firstly, the conventional seal ring has a configuration providing the circuit element on the inside of the seal ring. The objective of this configuration is to suppress that moisture or humidity or the like intrudes inside from outside of the seal ring, and to protect the circuit elements on the inside of the seal ring.

According to this configuration, a size of the seal ring increases, so that, among the seal ring, possibility of occurrence of portion where sealing property of moisture or humidity is insufficient increases. If there is the portion having insufficient seal property, in some cases, at the time of manufacturing the semiconductor device or at the time of using the semiconductor device, moisture or humidity intrudes the inside of the region provided with the circuit element, from outside of the seal ring through such a portion having insufficient seal property. Then, in some cases, function of the interlayer insulating film or the circuit element in the region deteriorates caused by intrusion of moisture or humidity. For this reason, there is still room for improvement in respect of reliability of the semiconductor device.

Further, although in cases where the damaged region of the semiconductor device is small, and the circuit element to be protected is relatively large, resulting in surrounding the circuit element with the seal ring, so that, in some cases, the region where the circuit element can be provided decreases in the semiconductor device. For this reason, there is still room for improvement in respect of high integration of the circuit element in the semiconductor device.

On the contrary, in the semiconductor device of the present embodiment, there is adopted configuration surrounding the multilayer insulating film of the lower portion of the fuse with the seal ring, therefore, in cases where the damaged portion occurring caused by the laser irradiation for the fuse is small, its problem may be eliminated by surrounding the small damaged portion.

For this reason, it is possible to protect the circuit element on the outside of the seal ring, even though the size of the seal ring is made smaller, as compared to the conventional seal ring, which is provided so as to surround a large circuit element on the inside thereof. Accordingly, it is possible to reduce possibility of occurring of insufficient portion of sealing property of moisture or humidity in the seal ring. Further, it is possible to secure the large region capable of providing the circuit element in the semiconductor device. Consequently, according to the present embodiment, as compared with the technique described in the above literature, it is possible to highly integrate the circuit element, and it is possible to obtain the semiconductor device that is excellent in reliability.

Second Embodiment

Figure 4:
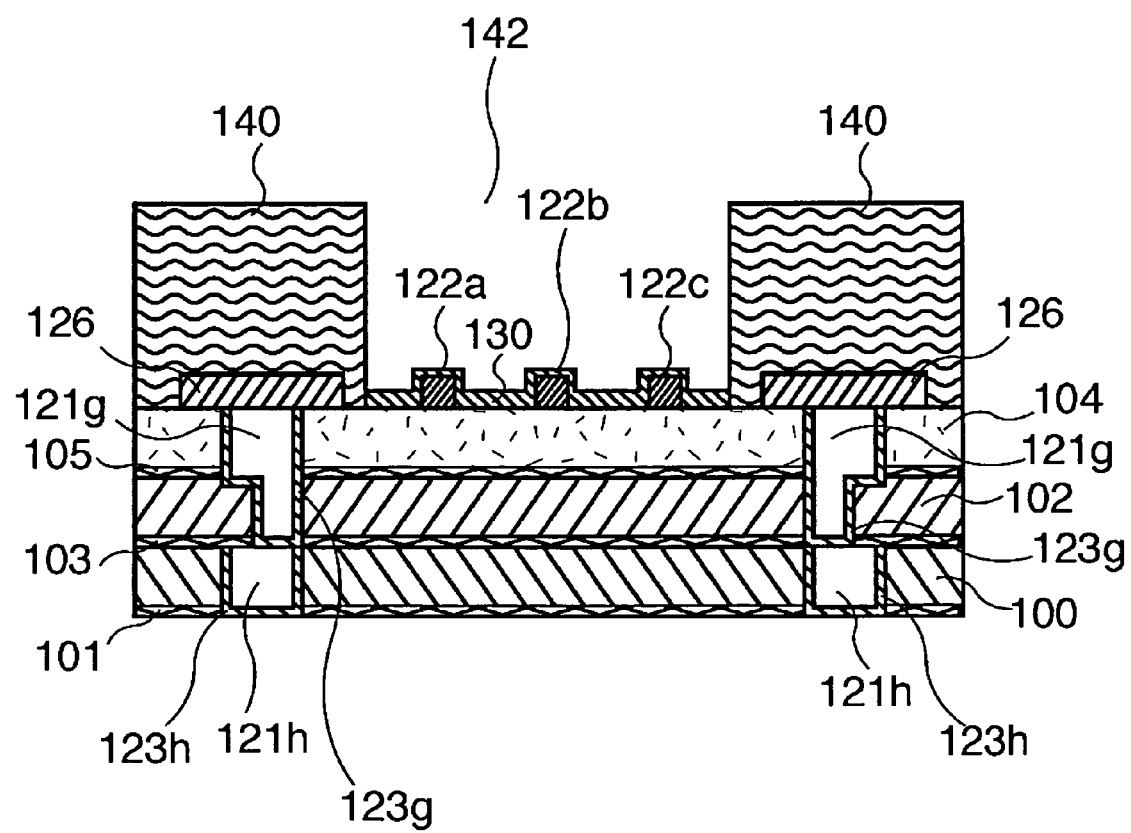
FIG. 4 is a sectional view schematically showing the semiconductor device provided with the seal ring structure of a second embodiment.

FIG. 4 is a sectional view schematically showing a modified example of the semiconductor device provided with the seal ring structure of the present embodiment. Basically, although the semiconductor device of the second embodiment has the same configuration as that of the semiconductor shown in the first embodiment, the semiconductor device of the second embodiment is further provided with a protective insulating film including a SiN film or a SiON film provided so as to cover an upper face of the fuse.

According to this configuration, the protective insulating film, which includes films made of material capable of suppressing intrusion of moisture or humidity, covers the upper face of the fuse, therefore, moisture or humidity is suppressed to intrude the region of the inside of the seal ring of the lower portion of the fuse.

Specifically, there is provided a fuse cover film 130 composed of a SiN film and a SiON film and the like in order to cover upper portions of the fuses 122a, 122b and 122c provided within a fuse window 142. Among these films, a SiN film is particularly preferable in respect of waterproof property. The film thickness of the fuse cover film 130 may be, for instance, not less than 50 nm to not more than 300 nm.

According to this configuration, the fuse cover film 130 has an effect to suppress permeation of moisture or humidity, therefore, it is possible to suppress that moisture or humidity in an atmosphere intrudes in the insulating film 104 from the fuse window 142.

Third Embodiment

Figure 5:
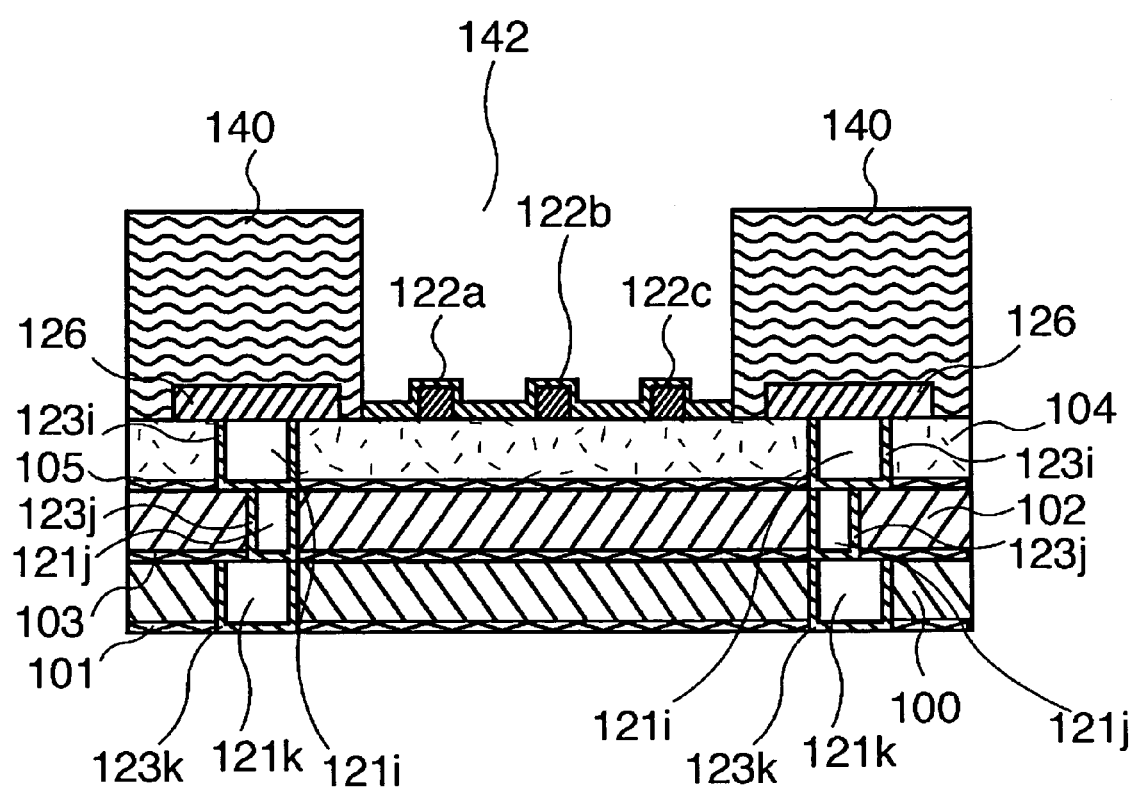
FIG. 5 is a sectional view schematically showing the semiconductor device provided with the seal ring structure of a third embodiment.

FIG. 5 is a sectional view schematically showing a modified example of the semiconductor device provided with the seal ring structure of the embodiment. Basically, although the semiconductor device of the third embodiment has the same configuration as the semiconductor device shown in the first embodiment, specifically, the ring shaped structure comprised of the copper containing metal film and the high melting point metal film in every interlayer insulating film is provided, and the seal ring is constituted by piling up these ring shaped structure.

Specifically, the seal ring is comprised of a copper containing film 121k and a barrier metal film 123k provided in the insulating film 100, a copper containing metal film 121j and a barrier metal film 123j provided in the insulating film 102, and a copper containing metal film 121i and a barrier metal film 123i provided in the insulating film 104.

Since FIG. 5 is a sectional view, although the copper containing metal film 121k and the barrier metal film 123k, the copper containing metal film 121j and the barrier metal film 123j, and the copper containing metal film 121i and the barrier metal film 123i are laterally illustrated in a left side of FIG. 5 and a right side of FIG. 5, these are the respective ring shaped same members.

According to this configuration, the copper containing metal films 121k, 121j and 121i provided in respective insulating films 100, 102 and 104 respectively have the barrier metal films 123k, 123j and 123i on the inside surface, on the bottom surface and on the outside surface. For this reason, in any of the insulating films 100, 102 and 104, moisture or humidity is stopped by three positions of the barrier metal films, therefore, leakage of moisture or humidity to outside of the seal ring is more effectively suppressed.

Further, according to this configuration, the seal ring is capable of being manufactured by a usual manufacturing method of the semiconductor device with multilayered interconnect structure of the so-called a single damascene structure, therefore, it is possible to manufacture the semiconductor device of the present embodiment according to the same manufacturing process as that of another member of the semiconductor device. For this reason, manufacturing stability of the semiconductor device is improved.

Fourth Embodiment

Figure 6:
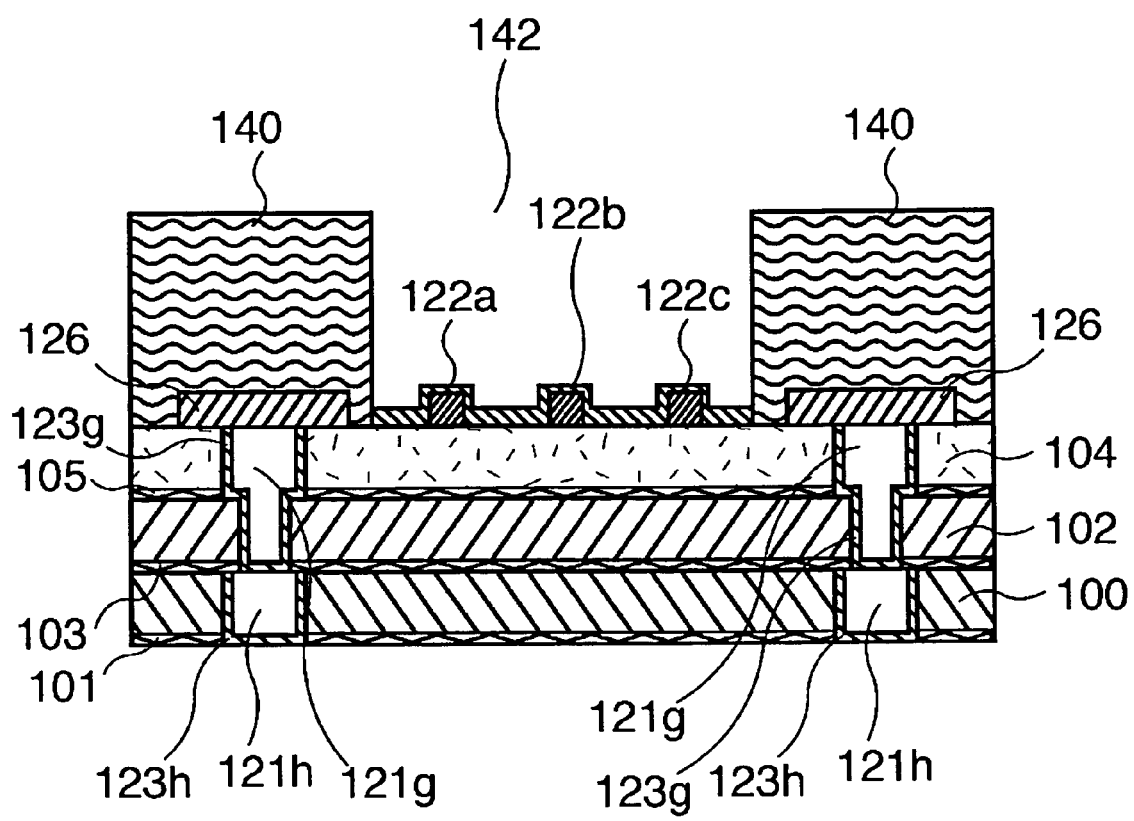
FIG. 6 is a sectional view schematically showing the semiconductor device provided with the seal ring structure of a fourth embodiment.

FIG. 6 is a sectional view schematically showing a modified example of the semiconductor device provided with the seal ring structure of the embodiment. Basically, the semiconductor device of the modified example of the first embodiment has the same configuration as the semiconductor device described in the first embodiment, however, the high melting point metal film of the inside surface of the seal ring does not form successive wall shaped structure.

Specifically, among a copper containing metal film 121h, a barrier metal film 123h, a copper containing metal film 121g, and a barrier metal film 123g, which constitute the seal ring, the high melting point metal film of the inside surface of the barrier metal film 123h and the barrier metal film 123g do not form successive wall shape structure.

For this reason, it is conceivable that small moisture or humidity from the gap of the inside surface of the barrier metal film 123h and the barrier metal film 123g may cause corrosion of the copper containing metal film 121h. Then, it is conceivable that small moisture or humidity leaks to outside of the seal ring from the gap of the outside surface of the barrier metal film 123h and the barrier metal film 123g while passing through the corrosion portion of the copper containing metal film 121h.

However, also in this case, the bulk of moisture or humidity is stopped by three positions of an inside surface, a bottom surface and an outside surface of the barrier metal film 123h and the barrier metal film 123g. Consequently, as compared with the case where the seal ring is not provided, leakage of moisture or humidity to outside of the seal ring is suppressed.

Fifth Embodiment

Figure 7:
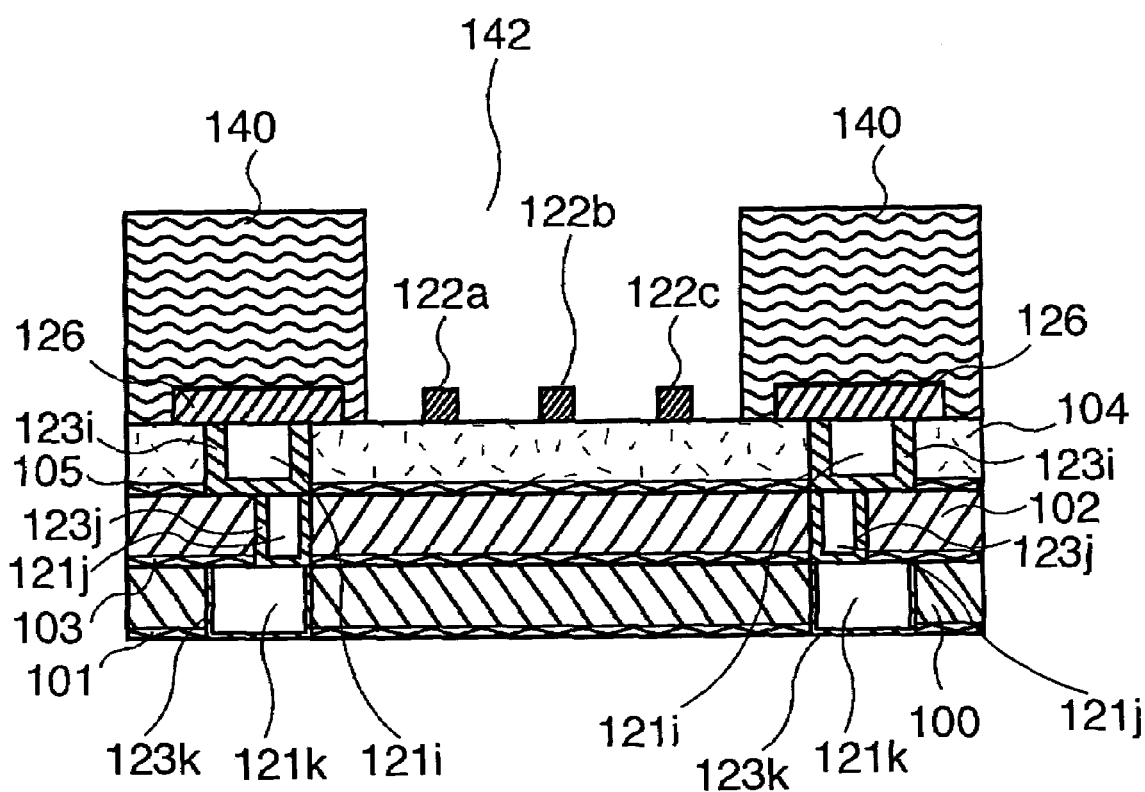
FIG. 7 is a sectional view schematically showing the semiconductor device provided with the seal ring structure of a fifth embodiment.

FIG. 7 is a sectional view schematically showing a modified example of the semiconductor device provided with the seal ring structure of the embodiment.

Basically, although the semiconductor device of the modified example of the first embodiment has the same configuration as the semiconductor device described in first embodiment, an insulating portion includes not less than two layers of the interlayer insulating films, and a thickness of a region embedded in the interlayer insulating film of the uppermost layer among the insulating portion is larger a than thickness of a region embedded in the interlayer insulating film, which is lower than the uppermost layer among the insulating portion, among the high melting point metal containing films of the inside surface of the seal ring.

According to this configuration, it is possible to further effectively suppress that moisture or humidity leaks to outside of the seal ring, because a thickness of the high melting point metal containing film of the inside surface of the seal ring of the uppermost layer into which moisture or humidity is easy to be intruded is large.

Specifically, a film thickness of the barrier metal films 123i, 123j and 123k may be taken to as 40 nm, 30 nm and 20 nm respectively. A thickness of the barrier metal film is not particularly limited, therefore, it may be suitable that a barrier metal of an upper layer is thick and a barrier metal of a lower layer is thin. The thickness of the barrier metal may be within the range that the most thinnest film thickness is 20 nm and the most thickest film thickness is 50 nm. If the film thickness of the barrier metal film is within this range, also in cases where the multilayered interconnect structure of the outside of the seal ring is made to manufacture in the same manufacturing process as the seal ring, the seal ring that is excellent in waterproof property may be obtained while suppressing increase of resistance of the multilayer interconnect structure.

In such a way as above, when the barrier metal is constituted in such a way that the film thickness of the barrier metal of the upper layer where possibility of intrusion of moisture or humidity is frequent is larger, the film thickness of the barrier metal of the lower layer is smaller, it is possible to effectively suppress that moisture or humidity leaks to the outside of the seal ring in the upper layer.

Further, in the present embodiment, the barrier metal provided on the seal ring, in some cases, is manufactured with the same process as the barrier metal provided on another interconnect structure in the same layer. In this case, also a thickness of the barrier metal in the interconnect structure of another lower layer may be reduced, therefore, it is possible to suppress increase of resistance of a lower layer interconnect of the multilayered interconnect structure.

Sixth Embodiment

Figure 8:
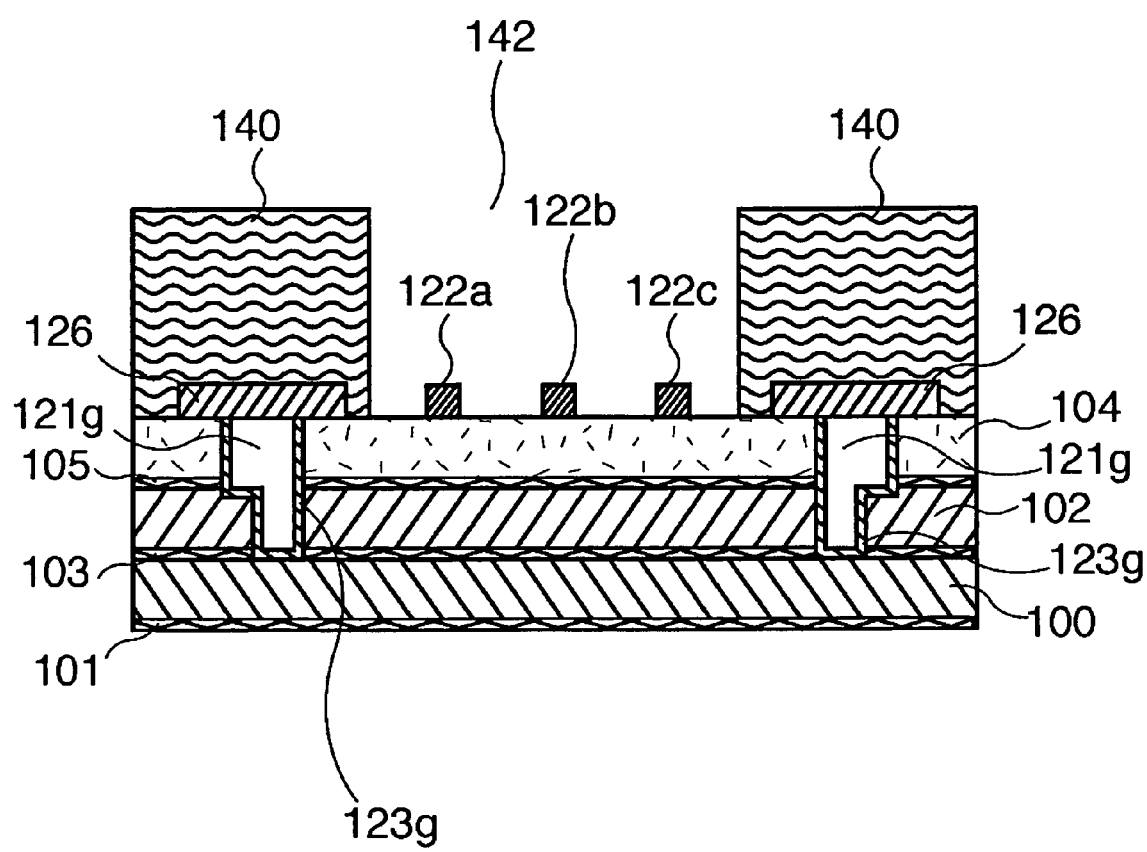
FIG. 8 is a sectional view schematically showing the semiconductor device provided with the seal ring structure of a sixth embodiment.

FIG. 8 is a sectional view schematically showing a modified example of the semiconductor device provided with the seal ring structure of the embodiment. Basically, although the semiconductor device of the modified example of the first embodiment has the same configuration as the semiconductor described in the first embodiment, a seal ring is not provided on the lower layer than the predetermined layer counted from the uppermost layer. For this reason, it is possible to effectively utilize space in the interlayer insulating film, which is lower than the predetermined layer, it is possible to improve an integration degree of the elements, and it is possible to make the semiconductor device smaller.

Specifically, although the seal ring is provided on the insulating film 104 and the insulating film 102, no seal ring is provided on the insulating film 100. According to this configuration, it is possible to provide the interconnect or the circuit element in the insulating film 100 and the insulating film lower than the insulating film 100, even though it is the region of the lower portion of the fuses 122a, 122b and 122c. For this reason, it is possible to effectively utilize space in the interlayer insulating film of the lower layer, to improve an integration degree of the elements, and to make the semiconductor device smaller.

There are provided the etch stopper film 103 composed of a SiC film or a SiCN film and the etch stopper film 105 composed of a SiN film or a SiON film, therefore, it is suppressed that moisture or humidity intrudes to the insulating film 100 from the insulating film 104 and the insulating film 102.

Seventh Embodiment

Figure 9:
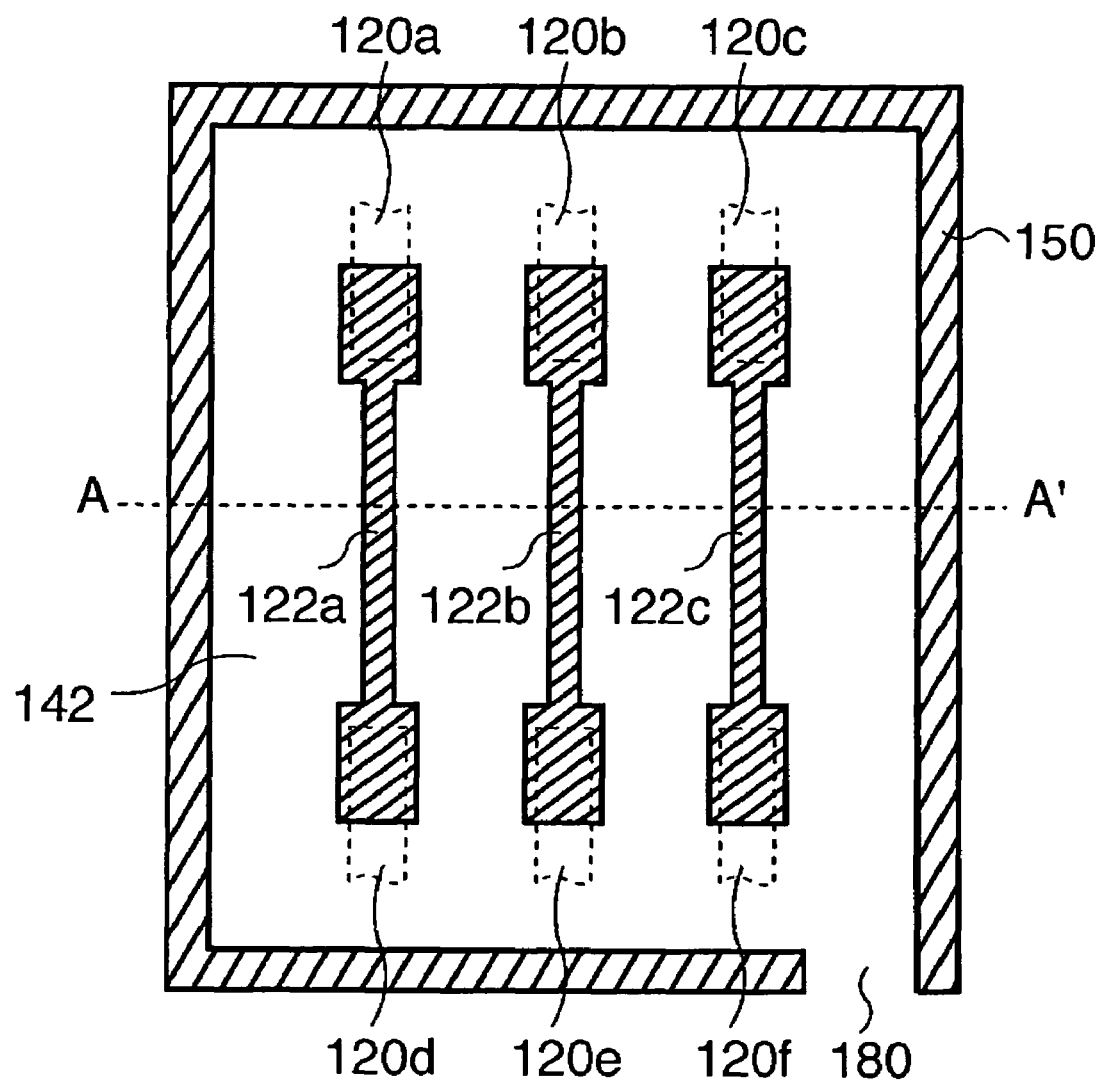
FIG. 9 is a plan view schematically showing the semiconductor device provided with the seal ring structure of a seventh embodiment.

FIG. 9 is a plan view schematically showing a modified example of the semiconductor device provided with the seal ring structure of the embodiment. Basically, although the semiconductor device of the modified example of the first embodiment has the same configuration as the semiconductor device described in the first embodiment, the seal ring of the seventh embodiment has a notch portion.

According to this configuration, it is possible to suppress that eddy current is generated in the seal ring, so that it is possible to suppress a magnetic field, which passes through the semiconductor substrate, generated caused by the eddy current, therefore, dielectric characteristics of the semiconductor device is improved.

Specifically, the notch portion 180 is provided on the seal ring 150.

According to this configuration, it is possible to suppress generation of the eddy current in the seal ring 150 because the notch portion 180 resides in the seal ring. For this reason, the dielectric characteristics of the semiconductor device is improved because it is possible to suppress generation of the magnetic field passing through the semiconductor substrate (not shown in the drawing). The notch portion 180 is only provided on a portion of the seal ring 150, therefore, it is possible to suppress that bulk of moisture or humidity intrudes to outside of the seal ring 150.

Eighth Embodiment

Figure 10:
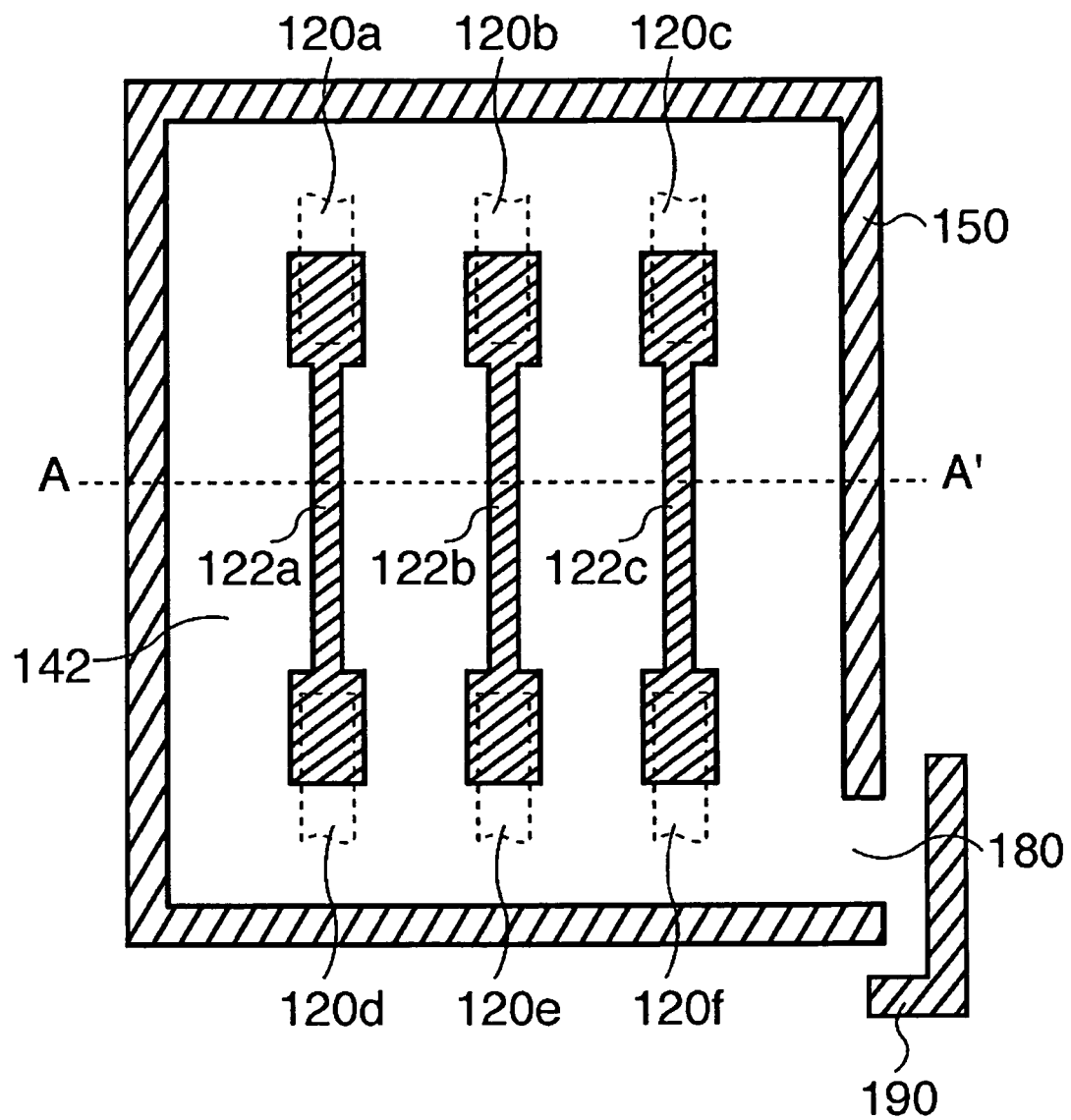
FIG. 10 is a plan view schematically showing the semiconductor device provided with the seal ring structure of an eighth embodiment.

FIG. 10 is a plan view schematically showing a modified example of the semiconductor device provided with the seal ring structure of the embodiment. Basically, although the semiconductor device of the modified example of the first embodiment has the same configuration as the semiconductor device described in the first embodiment, the high melting point metal containing film is further arranged in the vicinity of outside of the notch portion of the seal ring.

According to this configuration, it is possible to suppress that moisture or humidity intrudes to outside of the seal ring from the notch portion of the seal ring, because the high melting point metal containing film is further arranged.

Specifically, the notch portion 180 of one position is provided on the seal ring 150, and a patch portion 190 composed of the same constitution of the seal ring 150 is provided in the vicinity of outside of the notch portion 180. That is, also the patch portion 190 is provided with the copper containing metal film and the high melting point metal film containing W or TiN or the like covering the inside surface, the bottom surface and the outside surface of the copper containing metal film.

According to this configuration, the notch portion 180 resides, owing to this, it is possible to suppress generation of the eddy current in the seal ring 150. For this reason, it is possible to suppress generation of magnetic field passing through the semiconductor substrate (not shown in the drawings), therefore, it is possible to improve dielectric characteristics of the semiconductor device.

Further, in the vicinity of outside of the notch portion 180, the patch portion 190 is provided, therefore, it is possible to stop small moisture or humidity intruded from the notch portion 180 with the patch portion 190. Consequently, it is possible to further effectively suppress that moisture or humidity intrudes to outside of the seal ring 150.

Ninth Embodiment

Figure 11:
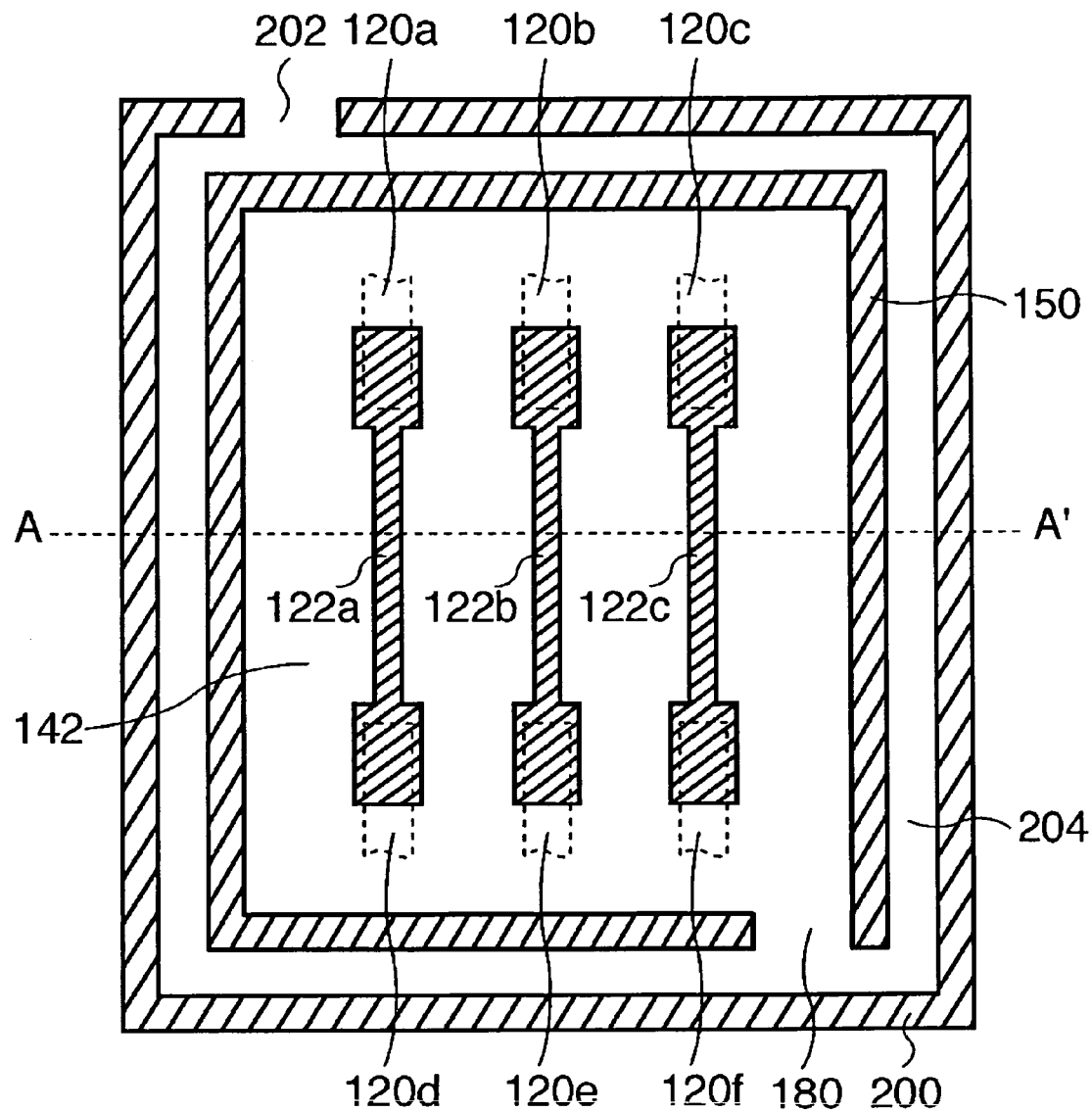
FIG. 11 is a plan view schematically showing the semiconductor device provided with the seal ring structure of a ninth embodiment.

FIG. 11 is a plan view schematically showing a modified example of the semiconductor device provided with the seal ring structure of the embodiment. Basically, although the semiconductor device of the modified example of the first embodiment has the same configuration as the semiconductor device described in the first embodiment, the seal ring is embedded in the insulating portion so as to surround the region just below the fuse not less than doubly surrounded. Further, the respective double seal rings have the notch portion each.

Specifically, the notch portion 180 is provided on the seal ring 150, and the second seal ring 200 having the second seal ring notch portion 202 is provided on outside of the seal ring 150. Also the second seal ring 200 is provided with the copper containing metal film, and the high melting point metal film containing W or TiN or the like covering the inside surface, the bottom surface and the outside surface of the copper containing metal film.

According to this configuration, the notch portion 180 and the second seal ring notch portion 202 reside, owing to this, it is possible to suppress that the eddy current is generated in the seal ring 150 and the second seal ring 200. For this reason, it is possible to suppress generation of the magnetic field passing through the semiconductor substrate (not shown in the drawings), therefore, it is possible to improve dielectric characteristics of the semiconductor device.

Further, the second seal ring 200 is provided on outside of the notch portion 180, therefore, it is possible to stop small moisture or humidity intruded from the notch portion 180 with the second seal ring 200. Consequently, it is possible to further effectively suppress that moisture or humidity intrudes to outside of the seal ring 150 and the second seal ring 200.

Tenth Embodiment

Figure 12:
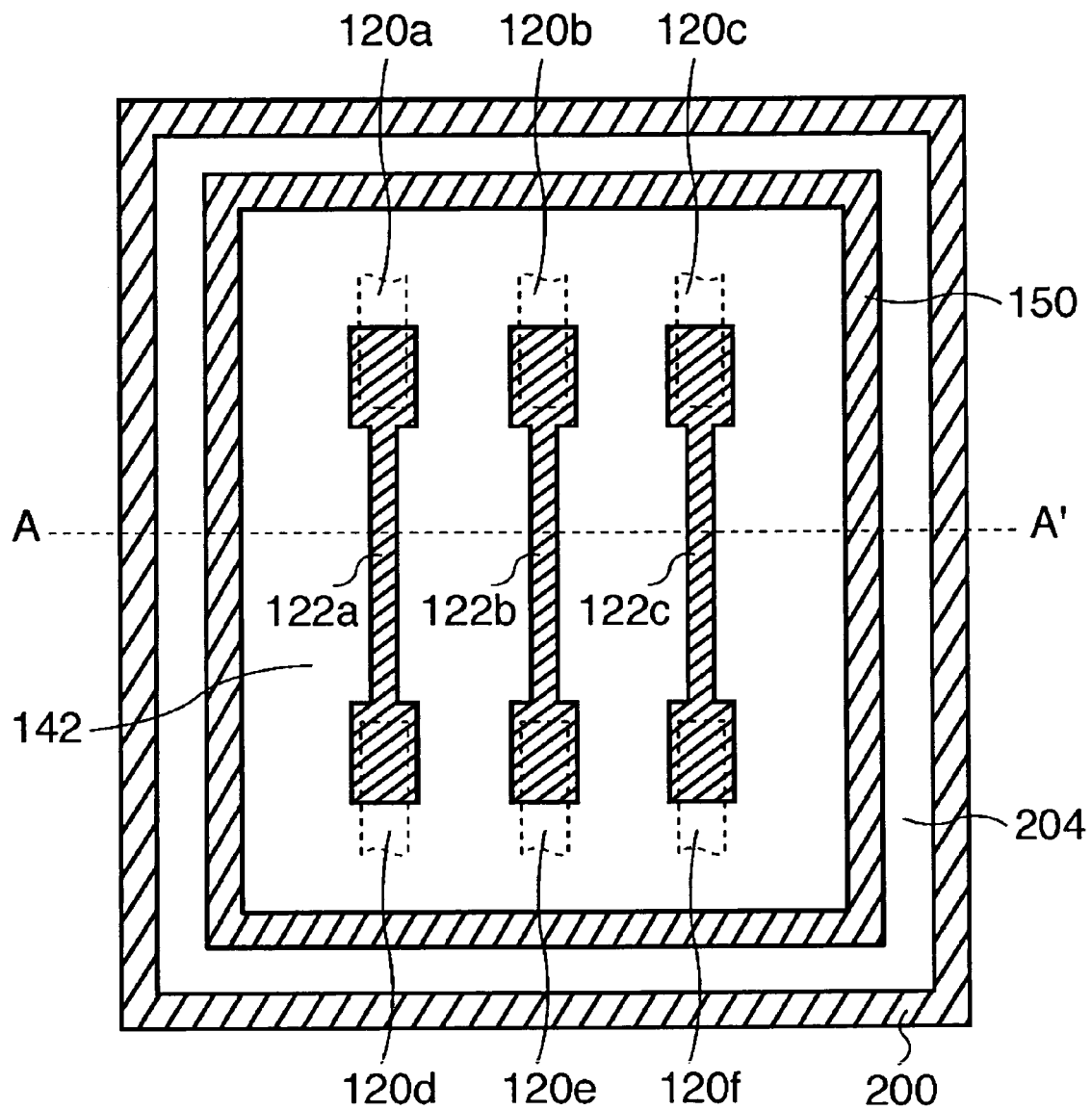
FIG. 12 is a plan view schematically showing the semiconductor device provided with the seal ring structure of a tenth embodiment.

FIG. 12 is a plan view schematically showing a modified example of the semiconductor device provided with the seal ring structure of the embodiment. Basically, although the semiconductor device of the modified example of the first embodiment has the same configuration as the semiconductor device described in the first embodiment, the seal ring is embedded in the insulating portion so as to surround the region just below the fuse not less than doubly surrounded.

According to this configuration, the above seal ring may suppress intrusion of moisture or humidity by the structure doubly surrounded, therefore, it is possible to further effectively suppress that moisture or humidity intrudes to outside of seal ring.

Specifically, the second seal ring 200 is provided on outside of the seal ring 150. Also the second seal ring 200 is provided with the copper containing metal film and the high melting point metal film containing W or TiN or the like covering the inside surface, the bottom surface and the outside surface of the copper containing metal film.

According to this configuration, the second seal ring 200 is provided on outside of the seal ring 150, therefore, it is possible to stop small moisture or humidity intruded from small gap of the seal ring 150 with the second seal ring 200. Consequently, it is possible to further effectively suppress that moisture or humidity intrudes to outside of the seal ring 150 and the second seal ring 200.

Eleventh Embodiment

FIG. 13A to FIG. 14F are process sectional view schematically showing a method for manufacturing the semiconductor device provided with the seal ring structure of the embodiment.

Figure 13A:
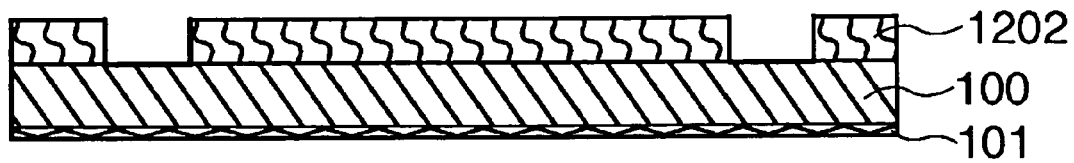
FIGS. 13A to 13C are process sectional views schematically showing a method for manufacturing the semiconductor device provided with the seal ring structure of an eleventh embodiment.

In order to manufacture the semiconductor device provided with a structure shown in FIG. 2, firstly, as shown in FIG. 13A, the etch stopper film 101 comprised of a SiC film or a SiCN film or the like, and the insulating film 100 comprised of a $SiO_2$ film or so-called Low-k film or the like are made to form over the semiconductor substrate (not shown in the drawings) in this order. A film thickness of the etch stopper film 101 is taken to be, for instance, degree of 70 nm. A film thickness of the insulating film 100 is taken to be, for instance, degree of 300 nm. A resist film 1202 provided with a predetermined ring shaped opening on an upper face of the insulating film 100.

Figure 13B:
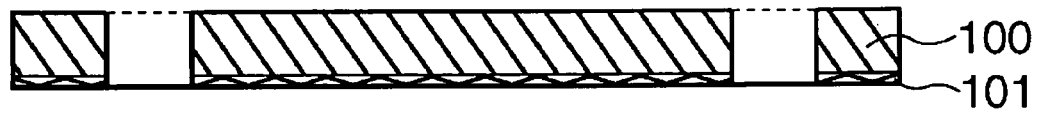

Next, as shown in FIG. 13B, the insulating film 100 is dry-etched using a resist film 1202 as a mask. Next, the etch stopper film 101 is dry-etched by changing an etching gas to form a ring shaped trench.

Figure 13C:
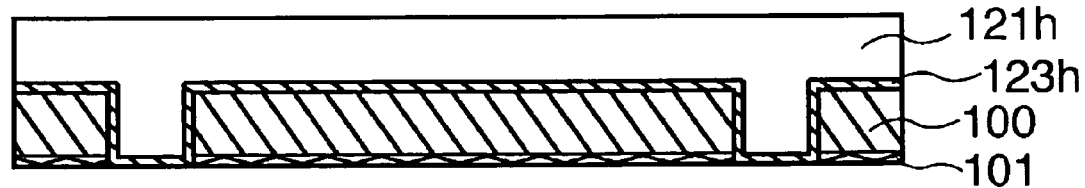

Successively, as shown in FIG. 13C, the barrier metal film 123*h* is formed on an upper face of the insulating film 100 and on inside face of the ring shaped trench. Further, the copper containing metal film 123*h* is formed on an upper face of the barrier metal film 123*h* and the remaining portion of the ring shaped trench. The remaining portion is a portion in which is not formed the barrier metal film 123*h* of the ring shaped trench.

Here, the barrier metal film 123*h* includes high melting point metals such as, for instance, Ti, W, Ta or the like. As more preferred barrier metal, for instance, Ti, TiN, W, WN, Ta, TaN or the like are exemplified. Particularly, a tantalum containing barrier metal in which TaN film is formed on Ta film may be preferably used. For instance, a film thickness of Ta may be made to be about 20 nm, and a film thickness of TaN may be made to be about 10 nm. The barrier metal is capable of being formed using a sputtering technique, a CVD technique or the like.

Further, the copper containing metal film 121$h$ is capable of forming by an electroplating technique. Before performing the electroplating, a seed copper containing metal film may be made to form by a spattering technique or the like.

Figure 14D:
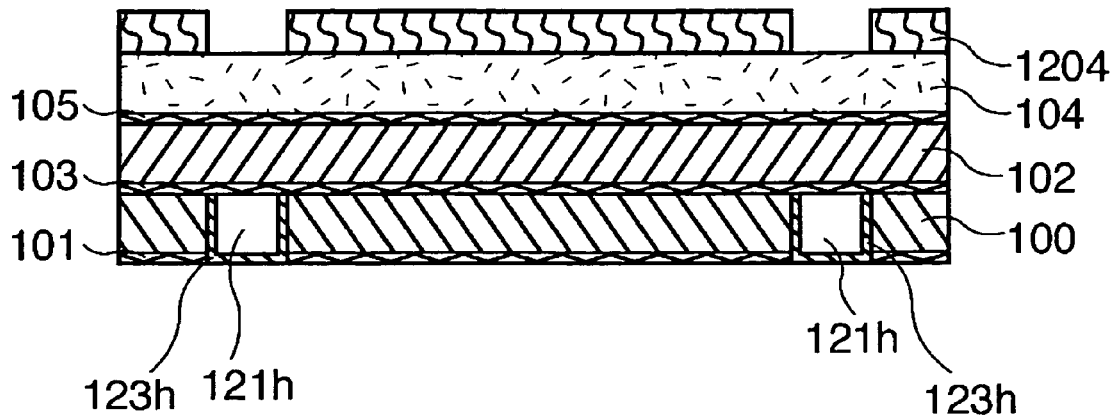
FIGS. 14D to 14F are process sectional views schematically showing the method for manufacturing the semiconductor device provided with the seal ring structure of the eleventh embodiment.

Then, as shown in FIG. 14D, an unnecessary portion of the copper containing metal film 121$h$ and the barrier metal film 123$h$ formed on outside of the ring shaped trench are made to strip by a CMP (Chemical Mechanical Polishing) technique such that the copper containing metal film 121$h$ and the barrier metal film 123$h$ are made to remain only on an inside portion of the ring shaped trench.

Further, the etch stopper film 103 composed of a SiC film or a SiCN film, the insulating film 102 composed of a $SiO_2$ film or so-called Low-k film, the etch stopper film 105 composed of a SiN film or a SiON film, and the insulating film 104 composed of a $SiO_2$ film or so-called Low-k film are made to form in this order on an upper portion of the exposed insulating film 100. A film thickness of the etch stopper films 103, 105 is taken to be, for instance, degree of 70 nm. A film thickness of the insulating films 102, 104 is taken to be, for instance, degree of 300 nm. There is provided the resist film 1204 provided with a predetermined ring shaped opening on upper face of the insulating film 100.

Figure 14E:
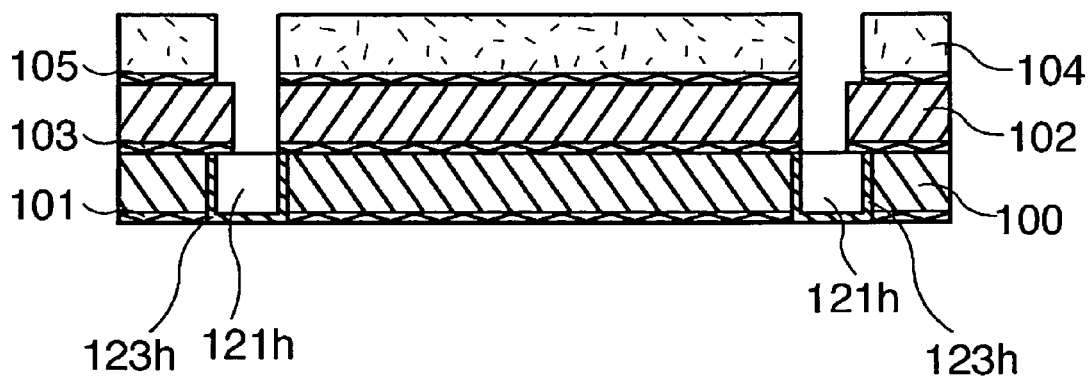

Next, as shown in FIG. 14E, the insulating film 104 is dry-etched using the resist film 1204 as the mask. Then, the etch stopper film 105 is etched while changing an etching gas. Further, the insulating film 102 is etched while changing an etching gas, after providing the resist film having the opening corresponding to the predetermined ring shaped opening formed in the insulating film 102. Successively, the etch stopper film 103 is etched while changing etching gas, followed by obtaining the ring shaped trench passing through the insulating film 102 and the insulating film 104.

Figure 14F:
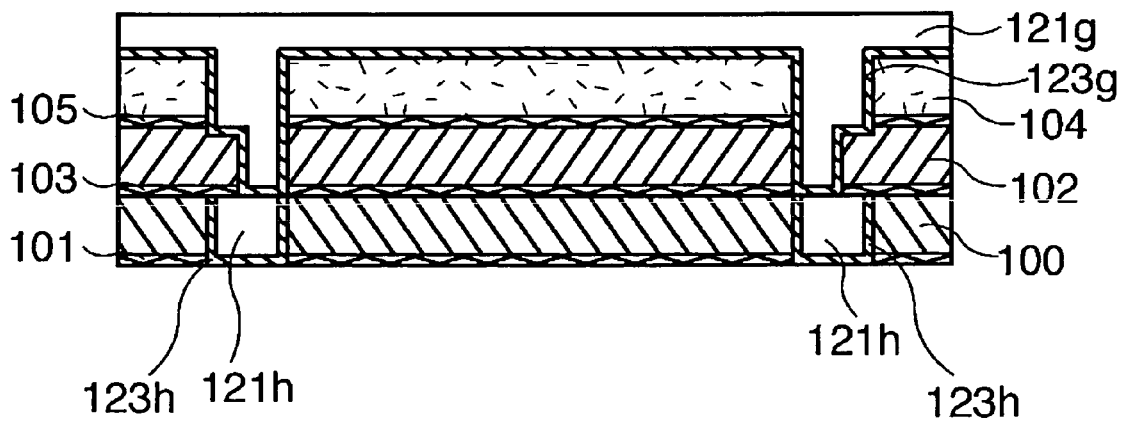

Successively, as shown in FIG. 14F, the barrier metal film 123$g$ is formed on an upper face of the insulating film 104 and on an inside face of the ring shaped trench. Further, the copper containing metal film 121$g$ is formed on an upper face of the barrier metal film 123$g$ and remaining part of the ring shaped trench. The remaining portion is a portion in which is not formed the barrier metal film 123$g$ of the ring shaped trench.

Here, the barrier metal film 123$g$ contains the high melting point metal such as, for instance, Ti, W, Ta or the like. As the preferable barrier metal film, for instance, Ta, TaN, Ti, TiN, W, WN, Mo, Cr and Ni are exemplified. In particular, a tantalum containing barrier metal formed TaN and Ta may be preferably used. For instance, a film thickness of Ta may be made to be about 20 nm, and a film thickness of TaN may be made to be about 20 nm. The barrier metal is capable of being formed in such a technique as the spattering technique, the CVD technique or the like.

Further, the copper containing metal film 121$g$ is capable of being formed with the electroplating technique. Before performing the electroplating, a seed copper containing metal film may be formed by the spattering technique or the like. A film thickness of the seed copper containing metal film is taken to be, for instance, degree of 100 nm. A film thickness formed by the electroplating technique is taken to be, for instance, degree of 200 nm.

Then, as shown in FIG. 2, an unnecessary portion of the copper containing metal film 121$g$ and the barrier metal film 123$g$ both formed on outside of the ring shaped trench are stripped with the CMP (Chemical Mechanical Polishing) technique. The copper containing metal film 121$g$ and the barrier metal film 123$g$ both are made to remain only on inside of the ring shaped trench.

Further, the fuses 122$a$, 122$b$ and 122$c$, and a seal ring upper portion film 126 composed of the high melting point metal film are formed by the same process on an upper portion of the insulating film 104. For instance, the fuses 122$a$, 122$b$, 122$c$, and the seal ring upper portion film 126 are capable of being formed by patterning the high melting point metal film with the photolithography technique, while forming the high melting point metal film composed of a multilayered film of a Ti film with a film thickness to be degree of 50 nm and a TiN film with a film thickness to be 150 nm, on whole surface of the insulating film 104. Here, as the high melting point metal film, the films containing Ta, TaN, Ti, TiN, W, WN, Mo, Cr and Ni are indicated.

The seal ring upper portion film 126 has a function as a corrosion stopper film of the copper containing metal film 121$g$. Further, the seal ring upper portion film 126 also has a role to make strength of the copper containing metal film 121$g$ larger.

Successively, after forming a cover film 140 formed so as to apply a polyimide film or the like, the fuse window 142 is provided by stripping the region containing the fuses 122$a$, 122$b$ and 122$c$ among the cover film 140 with the photolithography technique.

As above, although the embodiment of the present invention is described with reference to the drawings, these are exemplification of the present invention, it is possible to adopt various constitution other than the above.

For instance, with the above embodiments, a $SiO_2$ film is taken to be the interlayer insulating film, however, a SiN film or a SiON film may be taken to be the interlayer insulating film. In such a way as above, it is possible to obtain the advantage of improving waterproof property of the interlayer insulating film itself.

Further, in the above embodiment, there is adopted structure in which the region just below the fuse is surrounded by the seal ring, however there may be adopted structure in which a region just below a probe pad is surrounded by the seal ring. In such a way as above, even when a probe is brought into contact with the probe pad, a damaged portion occurs in the interlayer insulating film resulting in intrusion of moisture, there is an advantage that it is possible to suppress moisture leakage to outside of the seal ring.

Further, in the above embodiment, although the whole of the region just below the fuse is made to surround with the seal ring across a plurality of interlayer insulating films, the invention is not particularly limited to this constitution. That is, if it is possible to ensure insulation between the fuse and the seal ring, there may be adopted structure surrounding portion of a region just below the fuse. In this case, both end portions of the fuse may be made to be the structure provided on outside of the seal ring. Further, in order to ensure insulation between the fuse and the seal ring, it is effective that there is provided an insulating film between the fuse and the seal ring or between the fuse and the seal ring upper portion film.

It is apparent that the present invention is not limited to the above embodiment, that may be modified and changed without departing from the scope and sprit of the invention.

What is claimed is:

1. A semiconductor device comprising:
   a semiconductor substrate;
   an insulating portion provided over said semiconductor substrate, said insulating portion having at least two separate layers of insulating film;

a fuse provided on said insulating portion;
a seal ring that is electrically isolated from said fuse and embedded in said insulating portion from a top to a bottom of said insulating portion so as to surround a region of said insulating portion just below said fuse; and
a corrosion stopper film on said seal ring, said corrosion stopper film covering an entire top surface of said seal ring in a level where said fuse is provided, said corrosion stopper film being composed of a high melting point metal film,
wherein, an inside surface of said seal ring from the top to the bottom of said insulating portion is composed of a high melting point metal.

2. The semiconductor device according to claim 1, wherein the high melting point metal is selected from a group consisting of Ta, TaN, Ti, TiN, W, WN, Mo, Cr and Ni.

3. The semiconductor device according to claim 1, wherein said seal ring comprises:
not less than one coppercontaining metal, and
wherein said high melting point metal is a film that covers an inside surface, an outside surface and a bottom surface of said copper-containing metal.

4. The semiconductor device according to claim 1, wherein said fuse is composed of a high melting point metal film.

5. The semiconductor device according to claim 1, wherein said fuse is composed of a film containing not less than one metal selected from a group consisting of Ti, TiN, Ta, TaN, W, Mo, Cr and Ni.

6. The semiconductor device according to claim 1, further comprising a protective insulating film that covers an upper face of said fuse and includes one of a SiN film and a SiON film.

7. The semiconductor device according to claim 1, wherein said insulating portion comprises an etch stopper film containing one of a SiN film and a SiON film between said at least two layers of insulating film.

8. The semiconductor device according to claim 1, wherein said insulating portion comprises an etch stopper film containing one of a SiN film and a SiON film just below an uppermost of said at least two layers of insulating film.

9. The semiconductor device according to claim 1,
wherein said seal ring has a notch portion in plan view.

10. The semiconductor device according to claim 1, further comprising a second said seal ring embedded in said insulating portion and surrounding said region just below said fuse.

11. The semiconductor device according to claim 1, wherein said fuse and said corrosion stopper film are composed of the same high melting point metal film.

12. A semiconductor device comprising:
a semiconductor substrate;
an insulating portion provided over said semiconductor substrate, said insulating portion having at least two separate layers of insulating film;
a fuse provided on said insulating portion;
a seal ring that is electrically isolated from said fuse and embedded in said insulating portion from a top to a bottom of said insulating portion so as to surround a region of said insulating portion just below said fuse; and
a corrosion stopper film on said seal ring, said corrosion stopper film being in a level where said fuse is provided, said corrosion stopper film being composed of a high melting point metal film,
wherein, an inside surface of said seal ring from the top to the bottom of said insulating portion is composed of a high melting point metal, and
wherein a thickness of the high melting point metal on the inside surface of said seal ring embedded in an uppermost one of said at least two layers of insulating film is greater than a thickness of the high melting point metal on the inside surface of said seal ring embedded in a lower one of said at least two layers of insulating film.

13. A semiconductor device comprising:
a semiconductor substrate;
an insulating portion provided over said semiconductor substrate, said insulating portion having at least two separate layers of insulating film;
a fuse provided on said insulating portion;
a seal ring that is electrically isolated from said fuse and embedded in said insulating portion from a top to a bottom of said insulating portion so as to surround a region of said insulating portion just below said fuse; and
wherein, an inside surface of said seal ring from the top to the bottom of said insulating portion is composed of a high melting point metal,
wherein said seal ring has a notch portion in a plan view, and wherein, in a vicinity of outside of said notch portion of said seal ring, a part, which has the same structure as said seal ring and corresponds to a portion of said seal ring, is arranged at least so as to cover said notch portion.

* * * * *